(12) United States Patent
Do et al.

(10) Patent No.: US 12,176,353 B2
(45) Date of Patent: Dec. 24, 2024

(54) THIN FILM TRANSISTOR INCLUDING CRYSTALLIZED SEMICONDUCTOR, DISPLAY DEVICE INCLUDING THE SAME, MANUFACTURING METHOD OF THE SAME, AND METHOD FOR CRYSTALLIZING SEMICONDUCTOR

(71) Applicant: ADRC. CO. KR, Seoul (KR)

(72) Inventors: Youngbin Do, Seoul (KR); Chae Yeon Hwang, Seoul (KR)

(73) Assignee: ADRC. CO. KR, Seoul (KR)

( * ) Notice: Subject to any disclaimer, the term of this patent is extended or adjusted under 35 U.S.C. 154(b) by 0 days.

(21) Appl. No.: 18/099,380

(22) Filed: Jan. 20, 2023

(65) Prior Publication Data

US 2023/0154929 A1  May 18, 2023

Related U.S. Application Data

(62) Division of application No. 17/146,736, filed on Jan. 12, 2021, now Pat. No. 11,587,952.

(30) Foreign Application Priority Data

Mar. 2, 2020 (KR) ........................ 10-2020-0026137

(51) Int. Cl.
*H01L 21/02* (2006.01)
*H01L 27/12* (2006.01)
(Continued)

(52) U.S. Cl.
CPC .... *H01L 27/1222* (2013.01); *H01L 21/02422* (2013.01); *H01L 21/02488* (2013.01); *H01L 21/02532* (2013.01); *H01L 21/02592* (2013.01); *H01L 21/02683* (2013.01); *H01L 27/1218* (2013.01); *H01L 27/1266* (2013.01); *H01L 27/1274* (2013.01); *H01L 29/66757* (2013.01);
(Continued)

(58) Field of Classification Search
None
See application file for complete search history.

(56) References Cited

U.S. PATENT DOCUMENTS 8,735,233 B2  5/2014  Oda et al.
2012/0286282 A1* 11/2012 Sugawara ......... H01L 29/66765
257/66
2012/0309140 A1  12/2012  Oda et al.

FOREIGN PATENT DOCUMENTS

JP  2000-012484  1/2000
JP  2003-243321  8/2003
(Continued)

*Primary Examiner* — Jack S Chen
(74) *Attorney, Agent, or Firm* — LEX IP MEISTER, PLLC

(57) ABSTRACT

A thin film transistor according to an exemplary embodiment includes: a substrate; a semiconductor layer disposed on the substrate and including a channel region, and an input region and an output region disposed on both sides of the channel region and doped with an impurity; a buffer layer disposed between the substrate and the semiconductor layer; a control electrode overlapping the semiconductor layer; a gate insulation layer disposed between the semiconductor layer and the control electrode; and an input electrode connected to the input region and an output electrode connected to the output region, wherein the semiconductor layer includes polysilicon and is crystallized by a blue laser scan.

7 Claims, 44 Drawing Sheets

(51) Int. Cl.
  *H01L 29/66*     (2006.01)
  *H01L 29/786*    (2006.01)
  *G02F 1/1343*        (2006.01)
  *G02F 1/1368*        (2006.01)
  *H01L 27/15*         (2006.01)
  *H10K 59/121*        (2023.01)

(52) U.S. Cl.
  CPC .. *H01L 29/78675* (2013.01); *G02F 1/134309* (2013.01); *G02F 1/1368* (2013.01); *G02F 2202/104* (2013.01); *H01L 27/156* (2013.01); *H10K 59/1213* (2023.02)

(56) References Cited

FOREIGN PATENT DOCUMENTS

| KR | 10-2013-0035117 | 4/2013 |
| KR | 10-2014-0018081 | 2/2014 |
| KR | 10-2018-0047308 | 5/2018 |

\* cited by examiner

THIN FILM TRANSISTOR INCLUDING CRYSTALLIZED SEMICONDUCTOR, DISPLAY DEVICE INCLUDING THE SAME, MANUFACTURING METHOD OF THE SAME, AND METHOD FOR CRYSTALLIZING SEMICONDUCTOR

CROSS-REFERENCE TO RELATED APPLICATION

This application is a Divisional Application of U.S. patent application Ser. No. 17/146,736 filed on Jan. 12, 2021, which claims priority to and the benefit of Korean Patent Application No. 10-2020-0026137 filed in the Korean Intellectual Property Office on Mar. 2, 2020, the entire contents of which are incorporated herein by reference.

BACKGROUND

1. Field

The present disclosure relates to a thin film transistor including a crystallized semiconductor, and a display device including the same, and a manufacturing method thereof and a semiconductor crystallizing method.

2. Description of the Related Art

Thin film transistors including polysilicon have high mobility and are used in display devices.

On the other hand, as a portable nature of the display devices is emphasized, the need for flexible display devices that may be bent or foldable is increasing.

Therefore, a method for crystallization silicon on a substrate used in the flexible display device without damage to the substrate is important, and a thin film transistor included in the flexible display device should not be deteriorated in characteristics even when the display device is bent or folded.

The above information disclosed in this Background section is only for enhancement of understanding of the background of the described technology, and therefore it may contain information that does not form the prior art that is already known in this country to a person of ordinary skill in the art.

SUMMARY

An exemplary embodiment is to provide a thin film transistor including polysilicon in which a characteristic is not deteriorated and a flexible substrate is not damaged during a manufacturing process even when the flexible display device is bent or folded, a display device including the same, a manufacturing method thereof, and a semiconductor crystallizing method.

It is apparent that the object of the present invention is not limited to the above-described object, but may be variously extended within a range without departing from the spirit and scope of the present invention.

A thin film transistor according to an exemplary embodiment includes: a substrate; a semiconductor layer disposed on the substrate and including a channel region, and an input region and an output region disposed on both sides of the channel region and doped with an impurity; a buffer layer disposed between the substrate and the semiconductor layer; a control electrode overlapping the semiconductor layer; a gate insulation layer disposed between the semiconductor layer and the control electrode; and an input electrode connected to the input region and an output electrode connected to the output region, wherein the semiconductor layer includes polysilicon and is crystallized by a blue laser scan.

A display device according to an exemplary embodiment includes: a substrate; a semiconductor layer disposed on the substrate and including a channel region, and an input region and an output region disposed on both sides of the channel region and doped with an impurity; a buffer layer disposed between the substrate and the semiconductor layer; a control electrode overlapping the semiconductor layer; a gate insulation layer disposed between the semiconductor layer and the control electrode; an input electrode connected to the input region and an output electrode connected to the output region; a pixel electrode connected to the output electrode; and a common electrode overlapping the pixel electrode, wherein the semiconductor layer includes polysilicon and is crystallized by a blue laser scan.

The substrate may include a plastic.

The thickness of the buffer layer may be about 0.3 μm or more. More specifically, the thickness of the buffer layer may be about 1 μm or more. More specifically, the thickness of the buffer layer may be about 5 μm or more.

The semiconductor layer may be crystallized by full melting, partial melting, or may be a solid phase, and the full melt grain size, the partial melt crystallized grain size, and the solid crystallized grain size may be different.

The thickness of the semiconductor layer may be about 50 nm to about 300 nm.

The semiconductor layer may be crystallized with a blue laser line beam.

The grain boundary of the polysilicon may not be disposed in the channel region.

The semiconductor layer may be crystallized by a blue laser beam in the form of points, circles, or polygons.

The display device may further include a liquid crystal layer, an inorganic light emission layer, an organic light emission layer, or a quantum dot disposed between the pixel electrode and the common electrode.

The grain boundaries of the polysilicon may be almost parallel to the length direction of the channel region.

The angle between the grain boundaries and the length direction of the channel region may be within 30 degrees.

The interval between the adjacent grain boundaries may be about 1.2 μm or more.

After repeating an operation of folding the channel region 30,000 times, a change in the threshold voltage of the thin film transistor may be around 0.1 V.

A manufacturing method of a thin film transistor according to an exemplary embodiment includes: stacking a buffer layer on a substrate; forming a semiconductor layer on the buffer layer; forming a control electrode overlapping the semiconductor layer; and forming an input electrode connected to the input region and an output electrode connected to the output region, wherein the semiconductor layer is crystallized by using a blue laser.

The forming of the semiconductor layer may include: stacking an amorphous silicon layer on the buffer layer; and applying the blue laser on the amorphous silicon layer to be crystallized.

The crystallization may apply the blue laser beam having a wavelength of about 360 nm to 480 nm.

The semiconductor layer may be formed to have the thickness of about 50 nm to about 300 nm.

The forming of the semiconductor layer may include crystallization by a blue laser line beam scan or crystallization by a blue laser beam scan having a point, a circle, or a polygon shape.

The substrate may include a plastic, and the buffer layer may be formed to have a thickness of about 0.3 μm or more.

The semiconductor layer may be crystallized by full melting, partial melting, or may be a solid phase according to a power and a scan speed of the blue laser, and the full melt grain size, the partial melt crystallized grain size, and the solid crystallized grain size may be different.

The blue laser may be irradiated to be scanned in a direction parallel to the channel length direction of the channel region of the semiconductor layer.

A crystallizing method of amorphous silicon according to an exemplary embodiment includes: forming a buffer layer on a substrate; depositing amorphous silicon on the buffer layer; dehydrogenating the amorphous silicon; and crystallizing the dehydrogenated amorphous silicon by a blue laser scan.

In the forming of the buffer layer, an insulation layer including at least one of silicon dioxide ($SiO_2$) and a silicon nitride ($SiN_x$) may be formed with a thickness of about 0.3 μm or more.

In the depositing of the amorphous silicon, the amorphous silicon may be deposited with a thickness of 50 nm to 300 nm.

The crystallization may use the blue laser having a wavelength of 440 nm to 460 nm, and the crystallization may be performed by a blue laser line beam scan.

The crystallization may scan the blue laser line beam with a scan speed of 30 cm/s or more.

The width of the blue laser line beam may be 20 μm or less, and the length of the blue laser line beam may be 300 μm or more.

The crystallization may be performed by scanning a blue laser beam having a form of a point, a circle, or a polygon on the substrate surface in a direction perpendicular to a substrate movement direction.

According to an exemplary embodiment, the thin film transistor including the polysilicon in which the characteristics of the thin film transistor are not deteriorated even when the flexible display device is bent or folded, and the flexible substrate is not damaged during the manufacturing process, the display device including the same, the manufacturing method thereof, and the semiconductor crystallizing method may be provided.

It is apparent that the present invention is not limited to the above-described effects, and may be variously extended within a range without departing from the spirit and scope of the present invention.

BRIEF DESCRIPTION OF THE DRAWINGS

FIG. 16 is an electron microscope picture showing a result according to a sixth experimental example.

DETAILED DESCRIPTION

Figure 1:
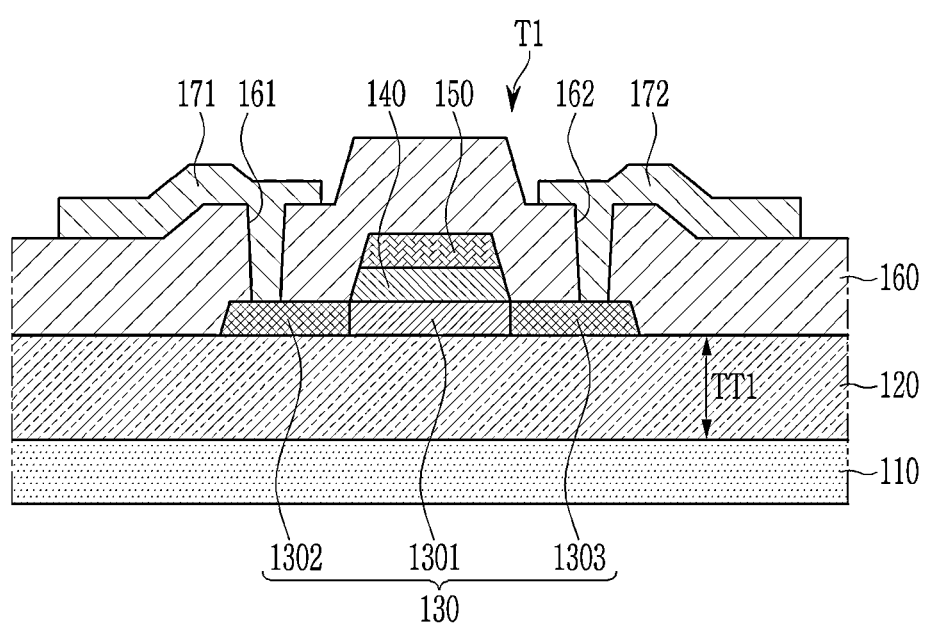
FIG. 1 is a cross-sectional view of a thin film transistor according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive, and like reference numerals designate like elements throughout the specification.

In addition, the size and thickness of each configuration shown in the drawings are arbitrarily shown for understanding and ease of description, but the present invention is not limited thereto. In the drawings, the thickness of layers, films, panels, regions, etc., are exaggerated for clarity. In the drawings, for understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

Hereinafter, preferred embodiments will be described below in detail with reference to the accompanying drawings. In order to facilitate entire understanding of the present invention in describing the present invention, the same reference number in the drawings will be used to describe the same components and an overlapped description of the same components will be omitted.

First, a thin film transistor according to an exemplary embodiment is described with reference to FIG. 1. FIG. 1 is a cross-sectional view of a thin film transistor according to an exemplary embodiment.

Referring to FIG. 1, a transistor T1 disposed on a substrate 110 is included.

A buffer layer 120 is disposed between the substrate 110 and the transistor T1, the thickness of the buffer layer 120 may be about 0.3 µm or more, the thickness of the buffer layer 120 may be about 1 µm or more, and more specifically, the thickness of the buffer layer 120 is about 5 µm or more.

The substrate 110 may include a polyimide. However, the substrate 110 is not limited thereto and may include other materials having good heat resistance, chemical resistance, abrasion resistance, and flexibility. In addition, the substrate 110 may have a structure in which two or more layers including a polyimide are stacked.

The substrate 110 may be flexible, but is not limited thereto, and may be stretchable, foldable, bendable, or rollable.

The buffer layer 120 may be formed of a single layer of a silicon nitride ($SiN_x$) or a double layer structure in which a silicon nitride ($SiN_x$) and silicon dioxide ($SiO_2$) are stacked.

The buffer layer 120 serves to planarize the surface while simultaneously preventing penetration of unnecessary components such as an impurity or moisture. In addition, the buffer layer 120 may be disposed between the semiconductor layer 130 and the substrate 110 to prevent heat generated during the crystallization of the semiconductor from being diffused to the substrate 110.

The transistor T1 includes a semiconductor layer 130 including a channel region 1301, and an input region 1302 and an output region 1303 disposed on both sides of the channel region 1301, a control electrode 150 overlapping the channel region 1301 of the semiconductor layer 130 via a gate insulation layer 140, and an input electrode 171 and an output electrode 172 respectively connected to the input region 1302 and the output region 1303.

The semiconductor layer 130 may include polysilicon. The semiconductor layer 130 may be crystallized by blue laser annealing (BLA) using a blue laser beam, which is a continuous-wave beam, after stacking amorphous silicon. For example, the blue laser annealing may use a blue laser having a wavelength of about 360 nm to 480 nm. More specifically, the blue laser annealing may use a blue laser having a wavelength of about 440 nm to 460 nm. The blue laser annealing may be performed by scanning the blue laser line beam having a width of 20 µm or less and a length of 300 µm or more on a substrate surface in a direction perpendicular to a substrate movement direction. The blue laser annealing may be performed by scanning the blue laser beam having the shape of a point, a circle, and a polygon on the substrate surface in the direction perpendicular to the substrate movement direction. The semiconductor layer 130 may have the thickness of about 50 nm to about 300 nm. A process of dehydrogenating the semiconductor layer 130 before the crystallization by the blue laser annealing may be further included.

Unlike the surface of the semiconductor layer crystallized by excimer laser annealing (ELA), the surface of the semiconductor layer 130 crystallized by the blue laser annealing may have no protrusion or its frequency may be small, and a grain size may be large, and a grain boundary may have a shape that extends in a direction parallel to the scan direction during the annealing. In addition, the semiconductor layer 130 of the transistor T1 according to the exemplary embodiment may be small in shape or characteristic change even during a plurality of folding operations, and may have the excellent foldability.

In addition, since the grain size of the semiconductor layer 130 crystallized by the blue laser annealing may be large, a grain boundary may not be disposed within the channel region 1301 of the semiconductor layer 130.

The channel region 1301 of the semiconductor layer 130 may be a region in which an impurity is not doped, and the input region 1302 and the output region 1303 of the semiconductor layer 130 may be regions doped with an impurity. The channel of the transistor T1 is formed in the channel region 1301 of the semiconductor layer 130.

A gate insulation layer 140 is disposed between the semiconductor layer 130 and the control electrode 150, and the gate insulation layer 140 may include a silicon oxide or a silicon nitride.

The control electrode 150 may be a single layer or multiple layers including a low-resistance material such as molybdenum (Mo), aluminum (Al), titanium (Ti), copper (Cu), nickel (Ni), or alloys thereof, or a material with strong corrosion resistance.

An interlayer insulation layer 160 is disposed on the semiconductor layer 130 and the control electrode 150, and the interlayer insulation layer 160 has a first contact hole 161 and a second contact hole 162 overlapping the input region 1302 and the output region 1303 of the semiconductor layer 130, respectively.

An input electrode 171 and an output electrode 172 are disposed on the interlayer insulation layer 160. The input electrode 171 and the output electrode 172 are connected to the input region 1302 and the output region 1303 of the semiconductor layer 130 through the first contact hole 161 and the second contact hole 162 of the interlayer insulation layer 160, respectively.

As described above, the semiconductor layer 130 may have a grain boundary extending along a direction almost parallel to the channel length direction, and the interval between two adjacent grain boundaries may be about 1.2 µm or more, while a maximum value is the length of the blue laser beam. The average of the interval between the grain boundaries may be about 1.5 µm to about 3 µm. In addition, a root average square roughness ($R_{RMS}$) of the surface of the semiconductor layer 130 may be about 5 nm to about 6 nm. More specifically, it may be about 5.58 nm.

In addition, since the grain size of the semiconductor layer 130 crystallized by the blue laser annealing may be large, the grain boundary may not be disposed within the channel region 1301 of the semiconductor layer 130.

In addition, the grain boundary of the semiconductor layer 130 may be substantially parallel to the channel length direction of the transistor, and the angle formed by the grain boundary with the channel length direction of the transistor may be within 30 degrees.

The transistor T1 may have a threshold voltage ($V_{th}$) of −2.7 V and a threshold field effect mobility (μFE) of 153 cm$^2$V$^{-1}$s$^{-1}$, and a sub-threshold hold swing (SS) value of the transistor T1 may be 0.2 V/dec.

In addition, after a plurality of folding operations, more specifically, after about 30,000 folding operations, a change in the threshold voltage of the transistor T1 may be around 0.1 V.

Figure 2:
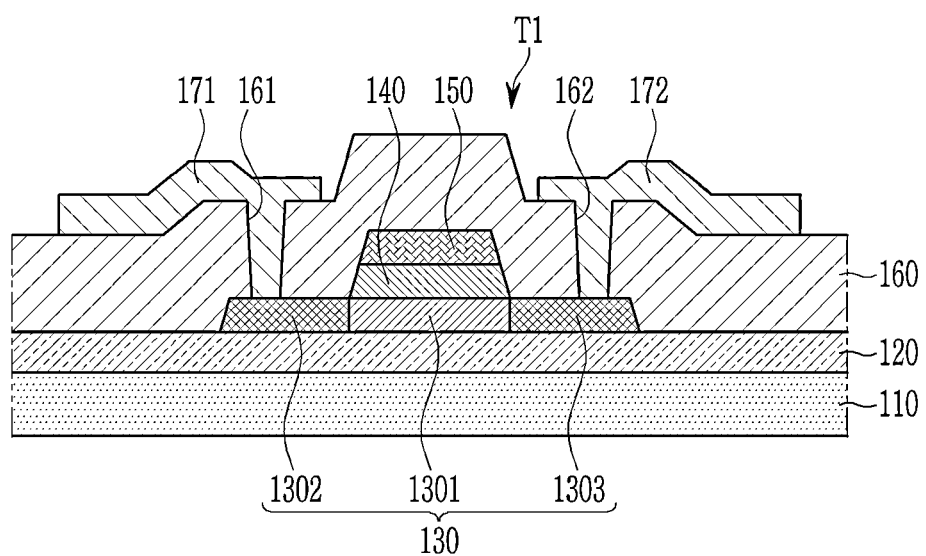
FIG. 2 is a cross-sectional view of a thin film transistor according to another exemplary embodiment.

Next, the thin film transistor according to an exemplary embodiment is described with reference to FIG. 2. FIG. 2 is a cross-sectional view of a thin film transistor according to another exemplary embodiment.

The substrate 110 may include a thin glass, and unlike the exemplary embodiment described with reference to FIG. 1, the thickness of the buffer layer 120 disposed between the substrate 110 and the transistor T1 may be about 0.1 μm or more.

When the substrate 110 is a glass substrate, even if heat generated during the crystallization of the semiconductor diffuses to the substrate 110, the damage to the substrate surface may be relatively small. Accordingly, the thickness of the buffer layer 120 disposed on the substrate 110 may be relatively thin.

The transistor T1 disposed on the buffer layer 120 includes the semiconductor layer 130 including the channel region 1301, and the input region 1302 and the output region 1303 disposed on both sides of the channel region 1301, the control electrode 150 overlapping the channel region 1301 of the semiconductor layer 130 via the gate insulation layer 140, and the input electrode 171 and the output electrode 172 respectively connected to the input region 1302 and the output region 1303.

The semiconductor layer 130 may include the polysilicon crystallized by the blue laser annealing (BLA) using the blue laser beam, which is the continuous-wave beam. Here, the blue laser annealing may use the blue laser having the wavelength of about 360 nm to 480 nm. More specifically, the blue laser annealing may use the blue laser having the wavelength of about 440 nm to 460 nm. The blue laser annealing may be performed by scanning the blue laser line beam having the width of less than 20 μm and the length of 300 μm or more on the substrate surface in the direction perpendicular to the substrate movement direction. The blue laser annealing may be performed by scanning the blue laser beam having a point circular shape or a polygonal shape on the substrate surface in the direction perpendicular to the substrate movement direction. A process of dehydrogenating the semiconductor layer 130 before the crystallization using the blue laser annealing may be further included.

The surface of the semiconductor layer 130 may have no protrusion or its frequency may be small, the grain size may be large, the semiconductor layer 130 may have the grain boundary extending along the direction approximately parallel to the channel length direction, and the interval between two adjacent grain boundaries may be about 1.2 μm or more, and the maximum value may be the length of the blue laser beam. The average of the intervals between the grain boundaries may be about 1.5 μm to about 3 μm. The angle formed between the grain boundary and the channel length direction of the transistor may be within 30 degrees. In addition, the root average square roughness ($R_{RMS}$) of the surface of the semiconductor layer 130 may be about 5 nm to about 6 nm. More specifically, it may be about 5.58 nm.

In addition, since the grain size of the semiconductor layer 130 crystallized by the blue laser annealing may be large, the grain boundary may not be disposed within the channel region 1301 of the semiconductor layer 130.

The semiconductor layer 130 may have the thickness of about 50 nm to about 300 nm.

The surface of the semiconductor layer 130 may have no protrusion or may have a small frequency, the grain size may be large, and the grain boundary may have the shape extending in the direction parallel to the scan direction during the annealing. The semiconductor layer 130 may have a small change in the shape or characteristic even during a plurality of folding operations and may have excellent foldability.

The control electrode 150 may be a single layer or multiple layers including a low-resistance material such as molybdenum (Mo), aluminum (Al), titanium (Ti), copper (Cu), nickel (Ni), or their alloys, or a material with strong corrosion resistance.

The interlayer insulation layer 160 is disposed on the semiconductor layer 130 and the control electrode 150, and the interlayer insulation layer 160 has a first contact hole 161 and a second contact hole 162 overlapping the input region 1302 and the output region 1303 of the semiconductor layer 130, respectively.

The input electrode 171 and the output electrode 172 are disposed on the interlayer insulation layer 160. The input electrode 171 and the output electrode 172 are connected to the input region 1302 and the output region 1303 of the semiconductor layer 130 through the first contact hole 161 and the second contact hole 162 of the interlayer insulation layer 160, respectively.

The transistor T1 may have the threshold voltage ($V_{th}$) of −2.7 V and the threshold field effect mobility (μFE) of 153 cm$^2$V$^{-1}$s$^{-1}$, and the sub-threshold hole swing (SS) value of the transistor T1 may be 0.2 V/dec.

In addition, after a plurality of folding operations, more specifically, after about 30,000 folding operations, the change in the threshold voltage of the transistor T1 may be around 0.1 V.

Figure 3:
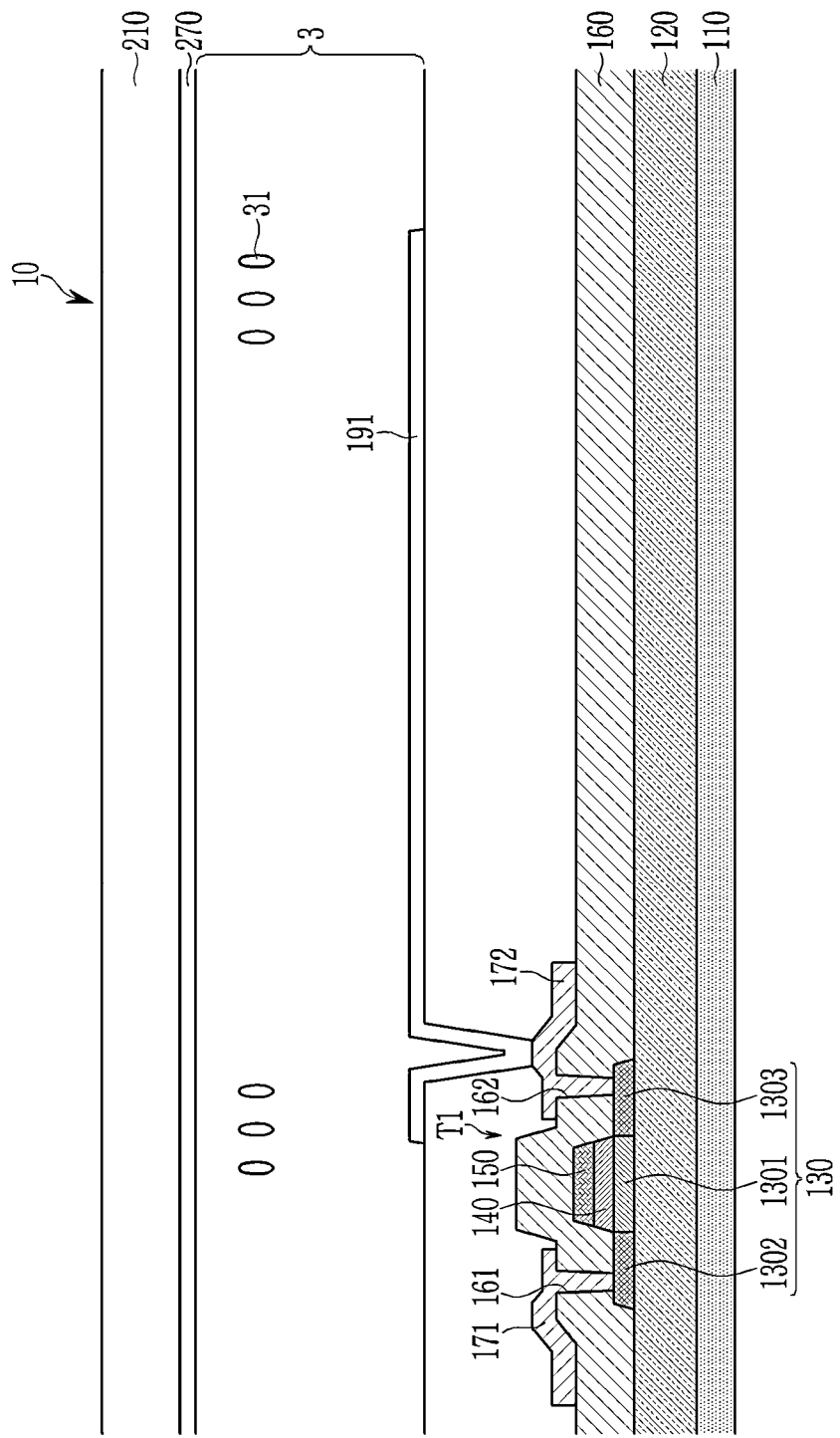
FIG. 3 is a cross-sectional view showing a part of a display device including a thin film transistor according to an exemplary embodiment.

Next, the display device including the thin film transistor according to an exemplary embodiment is described with reference to FIG. 3. FIG. 3 is a cross-sectional view showing a part of a display device including a thin film transistor according to an exemplary embodiment.

Referring to FIG. 3, the display device 10 according to the exemplary embodiment includes a transistor T1 disposed on the first substrate 110, a pixel electrode 191 connected to the output electrode 172 of the transistor T1, a second substrate 210 facing the first substrate 110, a liquid crystal layer 3 disposed between the first substrate 110 and the second substrate 210 and including a plurality of liquid crystal molecules 31, and a common electrode 270 disposed between the liquid crystal layer 3 and the second substrate 210.

The first substrate 110 and the second substrate 210 may be flexible, but are not limited thereto, and may be stretchable, foldable, bendable, or rollable.

A buffer layer 120 is disposed between the first substrate 110 and the transistor T1. When the first substrate 110 is a glass substrate, the thickness of the buffer layer 120 may be about 0.1 μm or more, and when the first substrate 110 is a plastic substrate such as a polyimide, the thickness of the buffer layer 120 may be about 0.3 μm or more. The buffer layer 120 serves to planarize the surface while simultaneously preventing the penetration of unnecessary components such as an impurity or moisture. In addition, the buffer layer 120 may be disposed between the semiconductor layer 130 and the substrate 110 to prevent heat generated during the crystallization of the semiconductor from being diffused to the substrate 110.

The transistor T1 includes a semiconductor layer 130 including a channel region 1301, and an input region 1302 and an output region 1303 disposed on both sides of the channel region 1301, a control electrode 150 overlapping the channel region 1301 via a gate insulation layer 140, and an input electrode 171 and an output electrode 172 respectively connected to the input region 1302 and the output region 1303 of the semiconductor layer 130 through the first contact hole 161 and the second contact hole 162 formed in the interlayer insulation layer 160.

The semiconductor layer 130 may include polysilicon. The semiconductor layer 130 may have the thickness of about 50 nm to about 300 nm. The semiconductor layer 130 may be crystallized by the blue laser annealing (BLA) after stacking the amorphous silicon. There is no protrusion on the surface of the semiconductor layer 130, and a shape deformation or a characteristic change may be small even during a plurality of folding operations.

The semiconductor layer 130 may have grain boundaries extending along the direction almost parallel to the channel length direction of the transistor T1, the interval between two adjacent grain boundaries may be about 1.2 μm or more, and the average of the intervals between grain boundaries may be about 1.5 μm to about 3 μm.

In addition, since the grain size of the semiconductor layer 130 crystallized by the blue laser annealing may be large, the grain boundary may not be disposed within the channel region 1301 of the semiconductor layer 130.

In addition, the root average square roughness ($R_{RMS}$) of the surface of the semiconductor layer 130 may be about 5 nm to 6 nm. More specifically, it may be about 5.58 nm.

Also, the angle formed by the grain boundary of the semiconductor layer 130 with the channel length direction of the transistor may be within 30 degrees.

The transistor T1 may have the threshold voltage ($V_{th}$) of −2.7 V and the threshold field effect mobility (μFE) of 153 cm2V−1s−1, and the sub-threshold hole swing (SS) value of the transistor T1 may be 0.2 V/dec. In addition, after a plurality of folding operations, more specifically, after about 30,000 folding operations, the change in the threshold voltage of the transistor T1 may be around 0.1 V.

The control electrode 150 of the transistor T1 is connected to a gate line (not shown) of the display device to receive a gate ON/OFF signal, and the input electrode 171 of the transistor T1 is connected to a data line (not shown) of the display device to receive a data voltage.

The data voltage is applied to the pixel electrode 191 through the output electrode 172. The pixel electrode 191 to which the data voltage is applied generates an electric field to the liquid crystal layer 3 together with a common electrode 270 to which a common voltage is applied, so that the liquid crystal molecules 31 of the liquid crystal layer 3 rotate or an inclination angle changes and the intensity of light passing through the liquid crystal layer 3 is adjusted, thereby displaying the image.

As described above, the first substrate 110 and the second substrate 210 of the display device 10 are flexible, whereby the display device 10 may be stretchable, foldable, bendable, or rollable.

The semiconductor layer 130 of the transistor T1 of the display device is a semiconductor crystallized by the blue laser annealing, has almost no protrusion on its surface, and has little shape change or characteristic change even in a plurality of folding operations. Accordingly, even when the display device 10 is folded, the characteristic of the display device 10 may be kept constant without changing, and thereby the quality of the display device 10 may be maintained.

Figure 4:
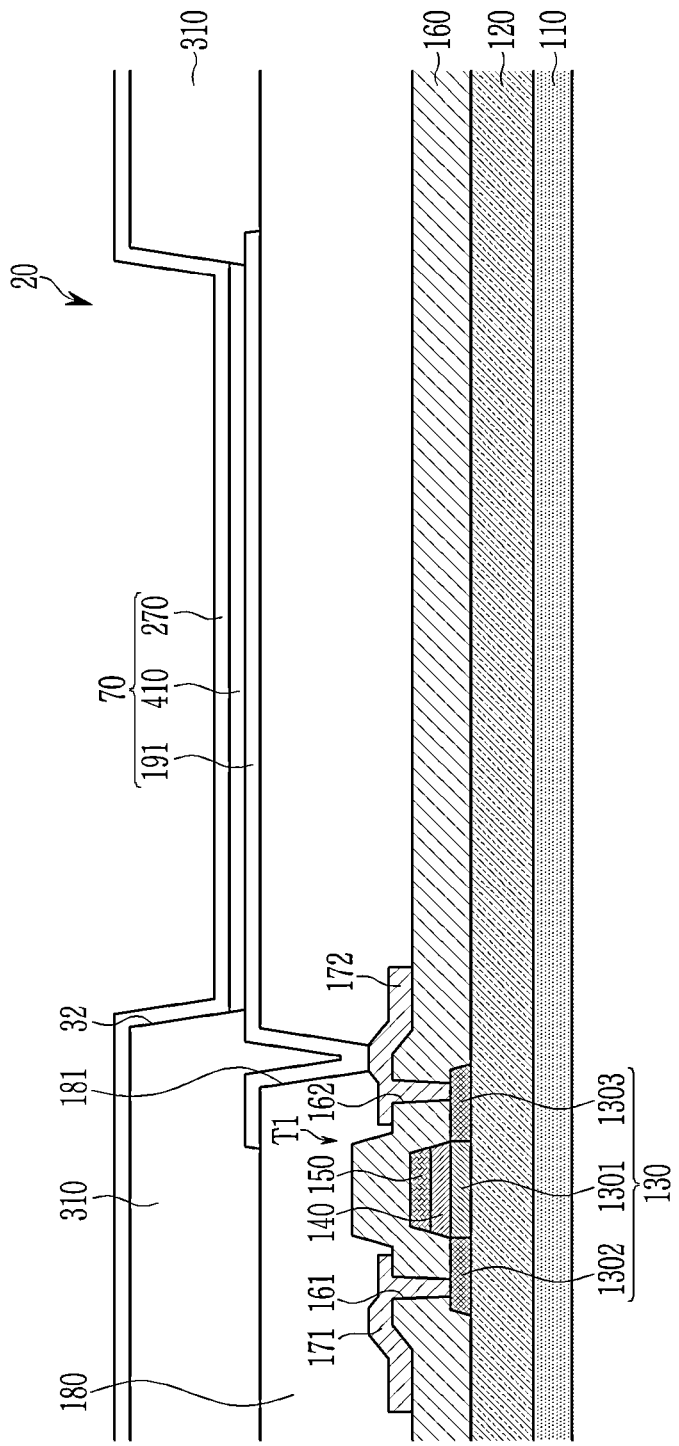
FIG. 4 is a cross-sectional view showing a part of a display device including a thin film transistor according to another exemplary embodiment.

Next, the display device including the thin film transistor according to the exemplary embodiment is described with reference to FIG. 4. FIG. 4 is a cross-sectional view showing a part of a display device including a thin film transistor according to another exemplary embodiment.

Referring to FIG. 4, a display device 20 according to the present exemplary embodiment includes a buffer layer 120 disposed on a substrate 110, a transistor T1 disposed on the buffer layer 120, a pixel electrode 191 connected to the output electrode 172 of the transistor T1, a pixel definition layer 310 having an opening 32 overlapping the pixel electrode 191, an organic light emission layer 410 disposed in the opening 32 of the pixel definition layer 310, and a common electrode 270 disposed on the organic light emission layer 410.

The substrate 110 may be flexible, but is not limited thereto, and may be stretchable, foldable, bendable, or rollable.

The buffer layer 120 is disposed between the first substrate 110 and the transistor T1. When the first substrate 110 is a glass substrate, the thickness of the buffer layer 120 may be about 0.1 μm or more, and when the first substrate 110 is a plastic substrate such as a polyimide, the thickness of the buffer layer 120 may be about 0.3 μm or more. The buffer layer 120 serves to planarize the surface while simultaneously preventing the penetration of unnecessary components such as impurity or moisture. In addition, the buffer layer 120 may be disposed between the semiconductor layer 130 and the substrate 110 to prevent heat generated during crystallization of the semiconductor from being diffused to the substrate 110.

The transistor T1 includes a semiconductor layer 130 including a channel region 1301, and an input region 1302 and an output region 1303 disposed on both sides of the channel region 1301, a control electrode 150 overlapping the channel region 1301 with each other via a gate insulation layer 140 therebetween, and an input electrode 171 and an output electrode 172 connected to the input region 1302 and the output region 1303 of the semiconductor layer 130 through the first contact hole 161 and the second contact hole 162 formed in the insulation layer 160, respectively.

The semiconductor layer 130 may include polysilicon. The semiconductor layer 130 may have a thickness of about 50 nm to about 300 nm. The semiconductor layer 130 may be crystallized by the blue laser annealing (BLA) after stacking amorphous silicon. There is no protrusion on the surface of the semiconductor layer 130, and the shape deformation or the characteristic change may be small even during a plurality of folding operations.

The semiconductor layer 130 may have grain boundaries extending along a direction almost parallel to the channel length direction, the interval between two adjacent grain boundaries is about 1.2 μm or more, and the average of the intervals between the grain boundaries may be about 1.5 μm to about 3 μm.

In addition, since the grain size of the semiconductor layer 130 crystallized by the blue laser annealing may be large, the grain boundary may not be disposed within the channel region 1301 of the semiconductor layer 130.

In addition, the root average square roughness ($R_{RMS}$) of the surface of the semiconductor layer 130 may be about 5 nm to 6 nm. More specifically, it may be about 5.58 nm.

Also, the angle formed by the grain boundary of the semiconductor layer 130 with the channel length direction of the transistor may be within 30 degrees.

The transistor T1 may have the threshold voltage ($V_{th}$) of −2.7 V, the threshold field effect mobility (μFE) of 153 $cm^2V^{-1}s^{-1}$, and the sub-threshold hole swing (SS) value of 0.2 V/dec. In addition, after a plurality of folding operations, more specifically, after about 30,000 folding operations, the change in the threshold voltage of the transistor T1 may be around 0.1 V.

The planarization layer 180 is disposed on the transistor T1, the planarization layer 180 has a third contact hole 181 that overlaps the output electrode 172 of the transistor T1, and the pixel electrode 191 is connected to the output electrode 172 of the transistor T1 through the third contact hole 181 of the planarization layer 180.

The control electrode 150 of the transistor T1 is connected to a control electrode connected to a gate line (not shown) of the display device to receive a gate ON/OFF signal and a data line (not shown) to be connected to an output electrode of a switching transistor (not shown) receiving a data voltage, thereby receiving the data voltage from the switching transistor. The input electrode 171 of the transistor T1 is connected to a driving voltage line (not shown) of the display device to receive a driving voltage, so that the driving voltage is applied to the pixel electrode 191. In addition to the switching transistor, the display device 20 may further include additional compensation transistors.

The organic light emission layer 410 is formed of a multi-layer including one or more among a light emission layer, a hole-injection layer (HIL), a hole-transporting layer (HTL), an electron-transporting layer (ETL), and an electron-injection layer (EIL).

When the organic light emission layer 410 includes all of these layers, the hole-injection layer is disposed on the pixel electrode 191 of an anode, and the hole-transporting layer, the light emission layer, the electron-transporting layer, and the electron-injection layer may be sequentially stacked thereon.

The organic light emission layer 410 may include a red organic emission layer which emits red light, a green organic emission layer which emits green light, and a blue organic emission layer which emits blue light, in which the red organic emission layer, the green organic emission layer, and the blue organic emission layer are respectively formed in a red pixel, a green pixel, and a blue pixel to implement color images.

The organic light emission layer 410 may also implement color images by stacking the red organic emission layer, the green organic emission layer, and the blue organic emission layer in all of the red pixel, the green pixel, and the blue pixel, and forming a red color filter, a green color filter, and a blue color filter for each pixel.

As another example, a white organic emission layer emitting light having a white color may be formed in all of the red pixel, the green pixel, and the blue pixel, and the red color filter, the green color filter, and the blue color filter may be formed for each pixel to embody the color image. When the color image is implemented by using the white organic emission layer and the color filter, a deposition mask for depositing the red organic emission layer, the green organic emission layer, and the blue organic emission layer on individual pixels, that is, the red pixel, the green pixel, and the blue pixel, is not required.

The white organic emission layer described in another example may be formed as a single organic emission layer, and may further include a configuration in which a plurality of organic emission layers are laminated to emit white light. For example, a configuration in which at least one yellow organic emission layer and at least one blue organic emission layer are combined to emit white light, a configuration in which at least one cyan organic emission layer and at least one red organic emission layer are combined to emit white light, and a configuration in which at least one magenta organic emission layer and at least one green organic emission layer are combined to emit white light may be further included.

The common electrode 270 may be made of a transparent conductive material such as an indium tin oxide (ITO), an indium zinc oxide (IZO), zinc oxide (ZnO), or indium oxide ($In_2O_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au).

The pixel electrode 191, the organic light emission layer 410, and the common electrode 270 form the organic light-emitting element 70, and the common electrode 270 may be the cathode of the organic light-emitting element 70.

According to another exemplary embodiment, the display device may include an inorganic light emission layer instead of the organic light emission layer 410.

According to another exemplary embodiment, the display device may include a quantum dot material in the organic light emission layer 410 or in place of the organic light emission layer 410, and when the display device includes a quantum dot material 410, the quantum dot material 410 may include a quantum dot material emitting three primary colors such as red, green, and blue.

Next, a manufacturing method of a thin film transistor according to an exemplary embodiment is described with reference to FIG. 5A to FIG. 5I. FIG. 5A to FIG. 5I are cross-sectional views showing a manufacturing method of a thin film transistor according to an exemplary embodiment.

Figure 5A:
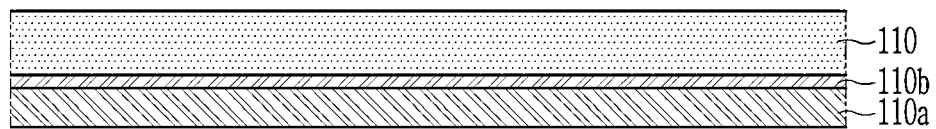
FIG. 5A to FIG. 5I are cross-sectional views showing a manufacturing method of a thin film transistor according to an exemplary embodiment.
Figure 5B:
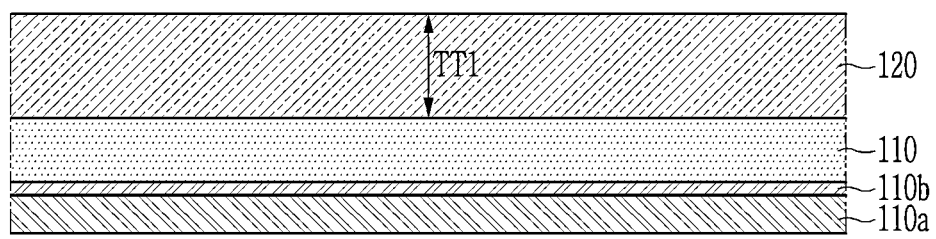

Referring to FIG. 5A, a flexible substrate 110 is attached to a supporting substrate 110a made of glass.

An adhesive layer 110b may be disposed between the supporting substrate 110a and the substrate 110.

The supporting substrate 110a supports the substrate 110 so that the flexible substrate 110 does not change its shape during the process of forming a transistor or the like thereon.

The substrate 110 may include thin glass or a polyimide, and may include other materials that have good heat resistance, chemical resistance, and abrasion resistance, and are flexible.

As shown in FIG. 4B, a buffer layer 120 is stacked on the substrate 110.

When the substrate 110 is a glass substrate, the thickness TT1 of the buffer layer 120 may be about 0.1 μm or more, and when the substrate 110 is a plastic substrate such as a polyimide, the thickness TT1 of the buffer layer 120 may be about 0.3 μm or more. The buffer layer 120 serves to planarize the surface while simultaneously preventing the penetration of unnecessary components such as an impurity or moisture. In addition, the buffer layer 120 may be disposed between the semiconductor layer 130 and the substrate 110 to prevent heat generated during the crystallization of the semiconductor from being diffused to the substrate 110. This is described in more detail later.

Figure 5C:
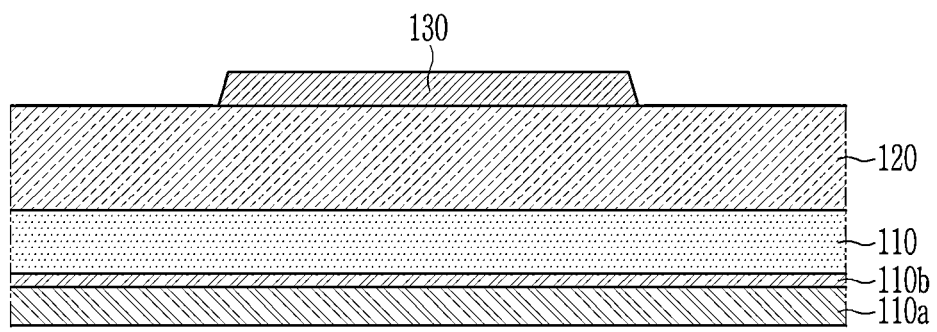

Referring to FIG. 5C, a semiconductor layer 130 is formed on the buffer layer 120. The semiconductor layer 130 includes polysilicon. The semiconductor layer 130 is formed through a photolithography and etching process using a first exposure mask after stacking an amorphous silicon layer on the buffer layer 120 and crystallizing it by the blue laser annealing. For example, the blue laser annealing may use a blue laser having a wavelength of about 360 nm to 480 nm. More specifically, the blue laser annealing may use a blue laser having a wavelength of about 440 nm to 460 nm. The blue laser annealing may be performed by scanning the blue laser line beam having a width of 20 µm or less and a length of 300 µm or more on a substrate surface in a direction perpendicular to a substrate movement direction. The blue laser annealing may be performed by scanning the blue laser beam having the shape of a point, a circle, and a polygon on the substrate surface in the direction perpendicular to the substrate movement direction. The semiconductor layer 130 may have the thickness of about 50 nm to about 300 nm. A process of dehydrogenating the amorphous silicon layer before crystallizing the semiconductor layer 130 by the blue laser annealing may be further included.

Figure 5D:
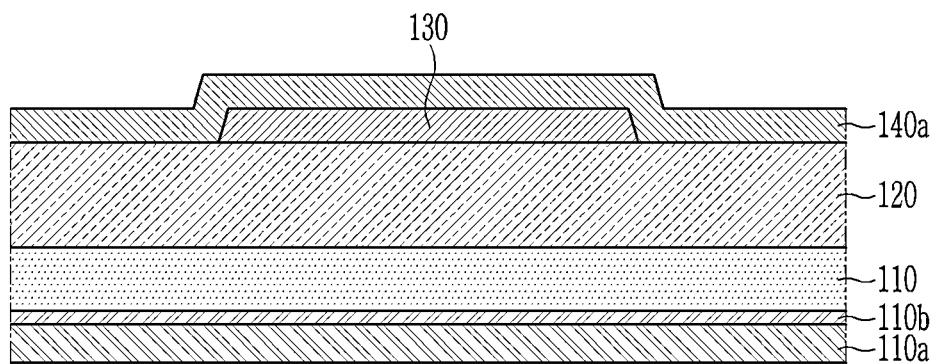

Referring to FIG. 5D, a first insulation layer 140a is stacked on the semiconductor layer 130. The insulation layer 140a may include a silicon oxide or a silicon nitride constituting the gate insulation layer 140.

Figure 5E:
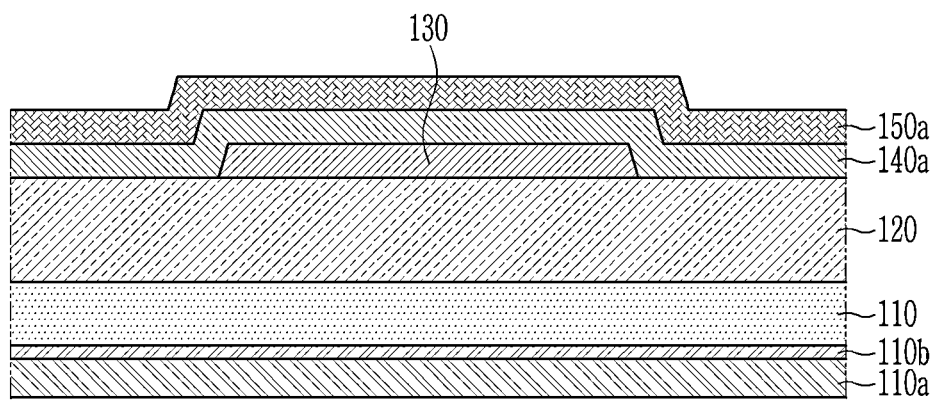

Referring to FIG. 5E, a first conductive layer 150a is stacked on the first insulation layer 140a. The first conductive layer 150a is a layer constituting the control electrode 150, and may be a single layer or multiple layers including a low resistance material or one having strong corrosion resistance such as molybdenum (Mo), aluminum (Al), titanium (Ti), copper (Cu), nickel (Ni), or their alloys.

Figure 5F:
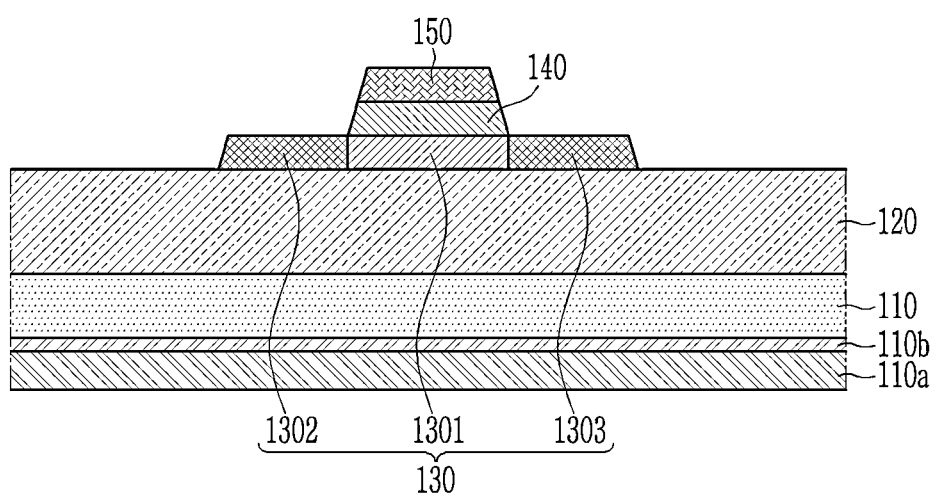

Next, the first conductive layer 150a and the underlying first insulation layer 140a are patterned by photolithography and etching using a second exposure mask to form a control electrode 150 and a gate insulation layer 140, and an impurity is doped to the semiconductor layer 130 using the control electrode 150 and the gate insulation layer 140 as a mask, as shown in FIG. 5F, to form a semiconductor layer 130 including a channel region 1301 without being doped with the impurity, and an input region 1302 and an output region 1303 doped with the impurity.

Figure 5G:
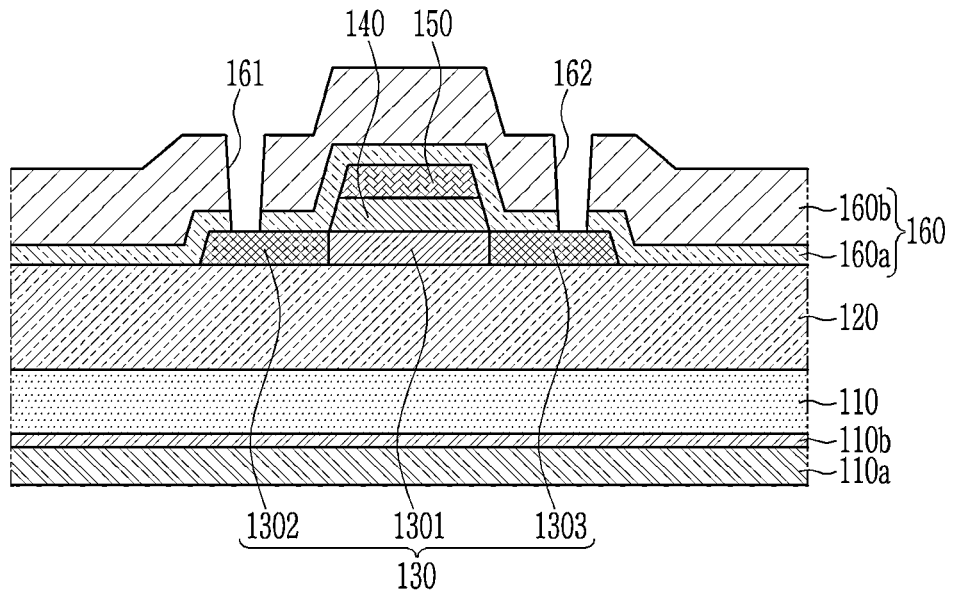

As shown in FIG. 5G, an interlayer insulation layer 160 including a first interlayer insulation layer 160a and a second interlayer insulation layer 160b is stacked and is subject to photolithography and etching using a third exposure mask to form a first contact hole 161 and a second contact hole 162 respectively overlapping the input region 1302 and the output region 1303 of the semiconductor layer 130 in the interlayer insulation layer 160. The interlayer insulation layer 160 may be a single layer or a triple layer.

Figure 5H:
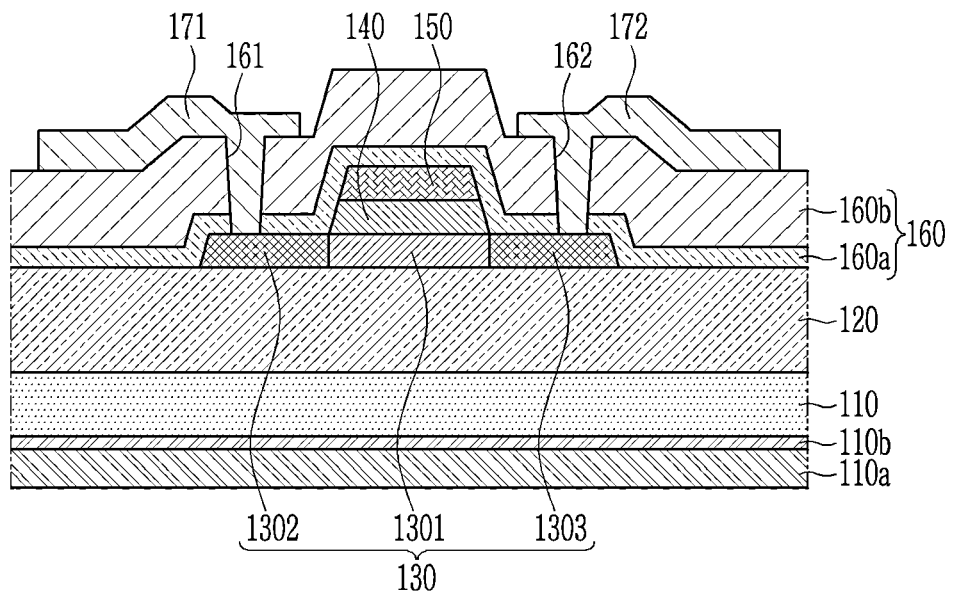

Referring to FIG. 5H, a second conductive layer is stacked on the interlayer insulation layer 160 and subjected to photolithography and etching using a fourth exposure mask to form an input electrode 171 and an output electrode 172 respectively connected to the input region 1302 and the output region 1303 of the semiconductor layer 130 through the first contact hole 161 and the second contact hole 162 of the interlayer insulation layer 160.

Figure 5I:
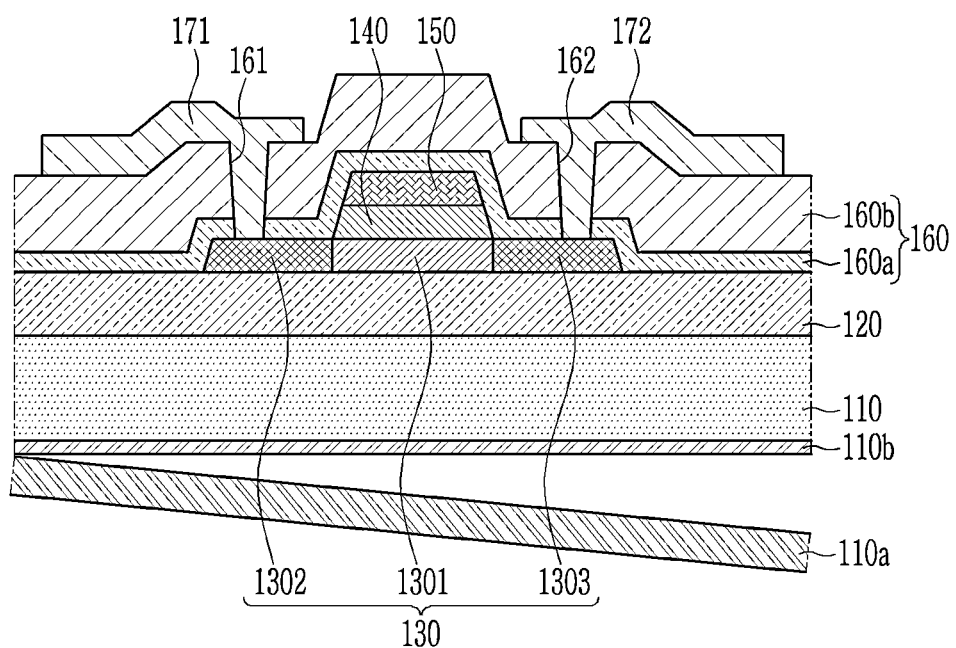

Next, as shown in FIG. 5I, the supporting substrate 110a is removed from the substrate 110, as shown in FIG. 1 or FIG. 2, to complete the transistor T1 on the substrate 110.

Figure 6A:
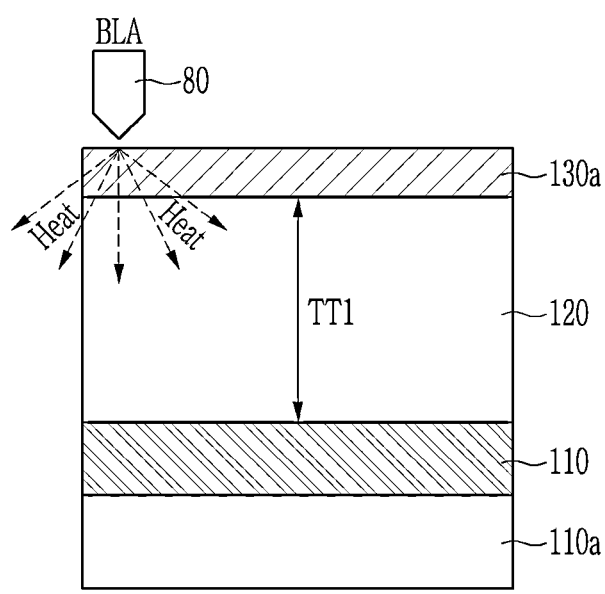
FIG. 6A to FIG. 6C are views to explain a crystallization process of a semiconductor layer according to a manufacturing method of a thin film transistor according to an exemplary embodiment.
Figure 6B:
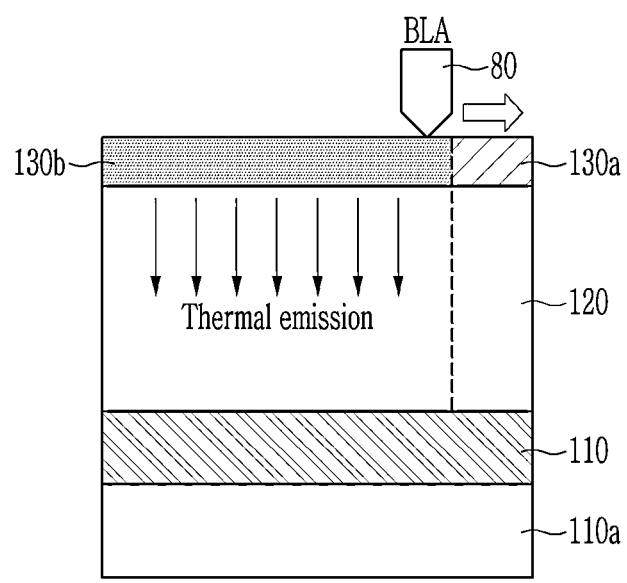
Figure 6C:
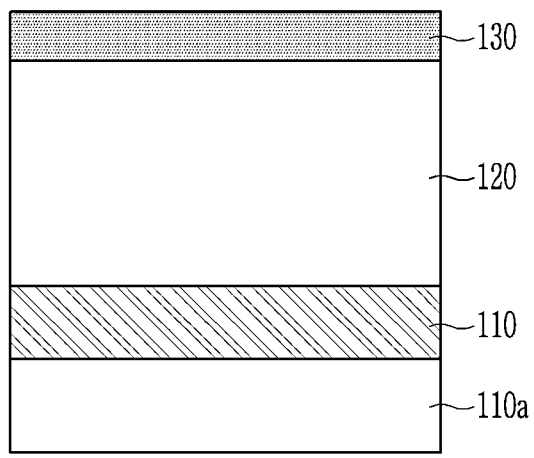

Next, the crystallization process of the semiconductor layer according to the manufacturing method of the thin film transistor according to the exemplary embodiment is described in more detail, with reference to FIG. 6A to FIG. 6C. FIG. 6A to FIG. 6C are views to explain a crystallization process of a semiconductor layer according to a manufacturing method of a thin film transistor according to an exemplary embodiment.

Referring to FIG. 6A, a supporting substrate 110a including glass is attached to a flexible substrate 110, a buffer layer 120 is stacked on the substrate 110, an amorphous silicon layer 130a is stacked on the buffer layer 120, and heat is applied to the amorphous silicon layer 130a by using a blue laser annealing apparatus 80 to be annealed. A process of dehydrogenating the amorphous silicon layer 130a before the annealing may be further included.

The blue laser annealing apparatus 80 may use a continuous wave blue laser having a wavelength of about 360 nm to 480 nm. More specifically, the blue laser of the blue laser annealing apparatus 80 may have a wavelength of about 440 nm to 460 nm. The blue laser annealing apparatus 80 may irradiate a blue laser, which is a continuous wave beam, to scan the semiconductor layer surface in a direction almost parallel to the channel length of the semiconductor layer, and the scan speed may be about 20 mm/s or more. The blue laser annealing apparatus 80 may scan the blue laser line beam having a width of 20 µm or less and a length of 300 µm or more on the substrate surface in the direction perpendicular to a substrate movement direction. The blue laser annealing apparatus 80 may scan the blue laser beam having the shape of a point, circle, or polygon on the substrate surface in the direction that is perpendicular to the substrate movement direction.

The type of the crystallization of the semiconductor layer may be different according to the scan speed of the blue laser beam, and the size of the crystallized grain may be different according to the type of the crystallization of the semiconductor layer. For example, when the scan speed of the blue laser beam is about 20 mm/s to about 50 mm/s, full melting crystallization may be achieved in which the amorphous silicon is completely melted and crystallized, when the scan speed of the blue laser beam is about In the case of 50 mm/s to about 130 mm/s, partial melting crystallization, in which amorphous silicon is partially melted and crystallized may be achieved, and when the scan speed of the blue laser beam is faster than about 130 mm/s, the amorphous silicon may be solid-crystallized (solid phase crystallization). As such, when using the blue laser beam, the crystallization of the amorphous silicon may be well performed even if the scan speed of the laser beam is relatively high. The grain size crystallized by the full melting, the grain size crystallized by the partial melting, and the grain size by the solid phase crystallization may be different each other. In another exemplary embodiment, the scan speed of the blue laser beam may be about 30 cm/s or more.

The thickness of the amorphous silicon layer 130a may be about 50 nm to about 300 nm.

Referring to FIG. 6B, due to the annealing through the blue laser annealing apparatus 80, a part of the amorphous silicon layer 130a supplied with the blue laser is polycrystallized to become a polysilicon layer 130b. At this time, heat is generated during the annealing, and the generated heat is diffused below the polysilicon layer 130b. According to the thin film transistor and the manufacturing method thereof according to an exemplary embodiment, when the substrate 110 is a glass substrate, the first thickness TT1 of the buffer layer 120 disposed between the substrate 110 and the semiconductor layer may be about 1 µm or more, and when the substrate 110 is a plastic substrate such as a polyimide, the first thickness TT1 of the buffer layer 120 disposed between the substrate 110 and the semiconductor layer may be about 5 µm or more. In this way, when the substrate 110 is a glass substrate, even if the heat generated during the crystallization of the semiconductor diffuses to the substrate 110, the substrate surface damage may be relatively small, and since the scan speed of the annealing device is about 20 mm/s or more, the time that heat is applied to the substrate 110 is relatively short. Therefore, when the first thickness TT1 of the buffer layer 120 is 0.1 μm or more, the glass substrate 110 may not be damaged by heat generated during the annealing.

In addition, when the substrate 110 is a plastic substrate that is weak to heat, since the first thickness TT1 of the buffer layer 120 is about 0.3 μm or more, the heat diffused through the buffer layer 120 does not affect the substrate 110, and the plastic substrate 110 may be prevented from being damaged by heat.

Since the blue laser absorption depth of the amorphous silicon layer 130a reaches about 200 nm, the semiconductor layer having the thickness of about 50 nm to about 300 nm may be melted through a short irradiation time, and the radius of the polycrystalline grain formed thereby is also big. Accordingly, during the annealing, the protrusions of the polycrystalline grain boundaries that may be formed on the surface of the semiconductor layer are not formed, or the number thereof is relatively small. In addition, the blue laser has high uniformity of the laser beam, so the wide silicon layer may be simultaneously melted at a high speed.

Accordingly, as shown in FIG. 6C, the semiconductor layer is annealed while the surface of the substrate 110 is not damaged to complete the semiconductor layer 130 including polysilicon, thereby forming the flat semiconductor layer 130 without the protrusion of the surface of the semiconductor layer 130, which may be generated on the polycrystalline grain boundary.

Figure 7A:
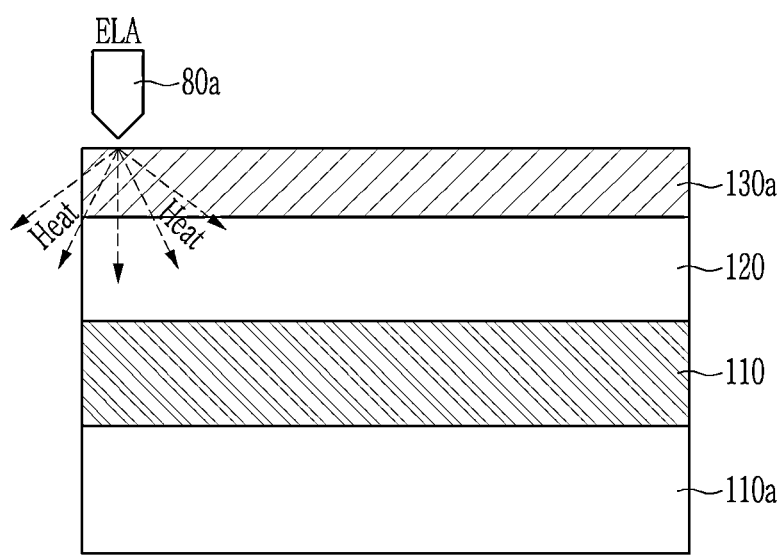
FIG. 7A to FIG. 7C are views to explain a crystallization process of a semiconductor layer according to a manufacturing method according to a conventional thin film transistor.
Figure 7B:
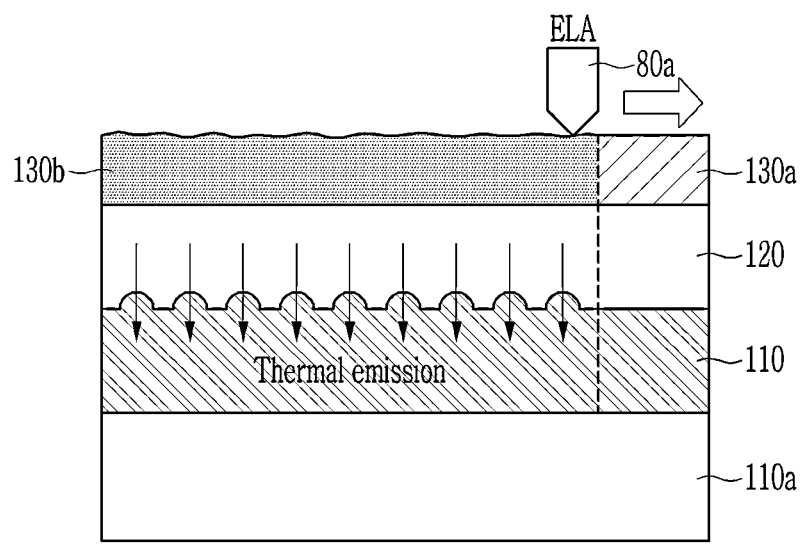
Figure 7C:
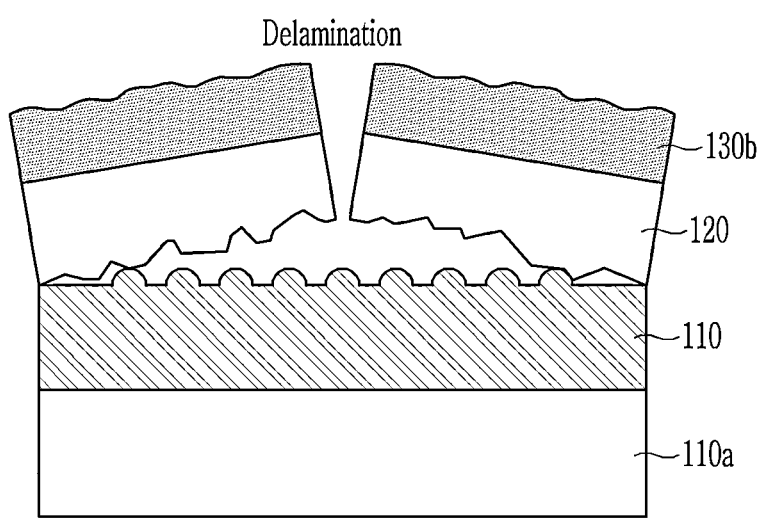

Next, the crystallization process of the semiconductor layer according to a conventional manufacturing method of the thin film transistor is described with reference to FIG. 7A to FIG. 7C. FIG. 7A to FIG. 7C are views to explain a crystallization process of a semiconductor layer according to a manufacturing method according to a conventional thin film transistor.

Referring to FIG. 7A, a supporting substrate 110a is attached under a flexible substrate 110, a buffer layer 120 is stacked on the substrate 110, an amorphous silicon layer 130a is stacked on the buffer layer 120, and heat is applied to the amorphous silicon layer 130a to be annealed by using an excimer laser annealing (ELA) apparatus 80a. The thickness of the amorphous silicon layer 130a may be about 50 nm to about 300 nm.

The excimer laser annealing apparatus 80a may use an excimer laser having a wavelength of about 300 nm, more specifically about 308 nm.

Referring to FIG. 7B, by annealing through the excimer laser annealing apparatus 80a, a part of the amorphous silicon layer 130a supplied by the excimer laser is poly-crystallized to be a polysilicon layer 130b. At this time, heat is generated during the annealing, and the generated heat is diffused under the polysilicon layer 130b, so that the surface of the substrate 110 is damaged by the heat, and a protrusion on the grain boundary is formed on the surface of the semiconductor layer 130 including polysilicon.

The excimer laser absorption depth of the amorphous silicon layer 130a is only about 50 nm, so the scan speed of the excimer laser is relatively slow to melt the amorphous silicon layer 130a having the thickness of about 50 nm to 300 nm, thereby the time when the excimer laser is applied to the amorphous silicon layer and the substrate may be relatively long, and the heat generated by this diffuses through the buffer layer 120 and then may affect the substrate 110 disposed thereunder even when the thickness of the buffer layer 120 is about 0.3 μm. Therefore, when the substrate 110 is a glass substrate or a plastic substrate, or when the semiconductor layer is crystallized using the excimer laser, the surface of the substrate 110 disposed under the buffer layer 120 may be damaged by heat.

In addition, since the excimer laser absorption depth of the amorphous silicon layer 130a is only about 50 nm, the grain diameter of the polysilicon layer 130b formed through excimer laser annealing may be less than about 50 nm, and a distribution density of the protrusion generated on the grain boundary of the polysilicon layer 130b also becomes large.

Thereby, as shown in FIG. 7C, when the semiconductor layer 130 including polysilicon is completed, the surface of the substrate 110 is damaged by heat, a relatively large amount of protrusions at the grain boundary are formed on the surface of the semiconductor layer 130 including polysilicon, and the surface of the substrate 110 is damaged by the heat generated during the annealing, thereby the buffer layer 120 may be peeled off from the substrate 110.

As above-described, according to the thin film transistor and the manufacturing method thereof according to the exemplary embodiment, by forming the thin film transistor having the channel region including the polysilicon layer by crystallizing the amorphous silicon layer by the blue laser annealing, as heat generated during the annealing is diffused in the buffer layer and then does not affect to the flexible substrate, the damage of the substrate may be prevented, and as the grain radius of the polysilicon layer is relatively large, the thickness of the semiconductor layer may be made relatively thick and the protrusions that may occur in the grain boundaries on the surface of the semiconductor layer may be prevented. In addition, even when the substrate includes a plastic, the buffer layer having the thickness of about 0.3 μm or more is formed between the substrate and the amorphous silicon layer, thereby preventing the substrate surface from being damaged by heat generated when the semiconductor layer is subjected to blue laser annealing.

Figure 8A:
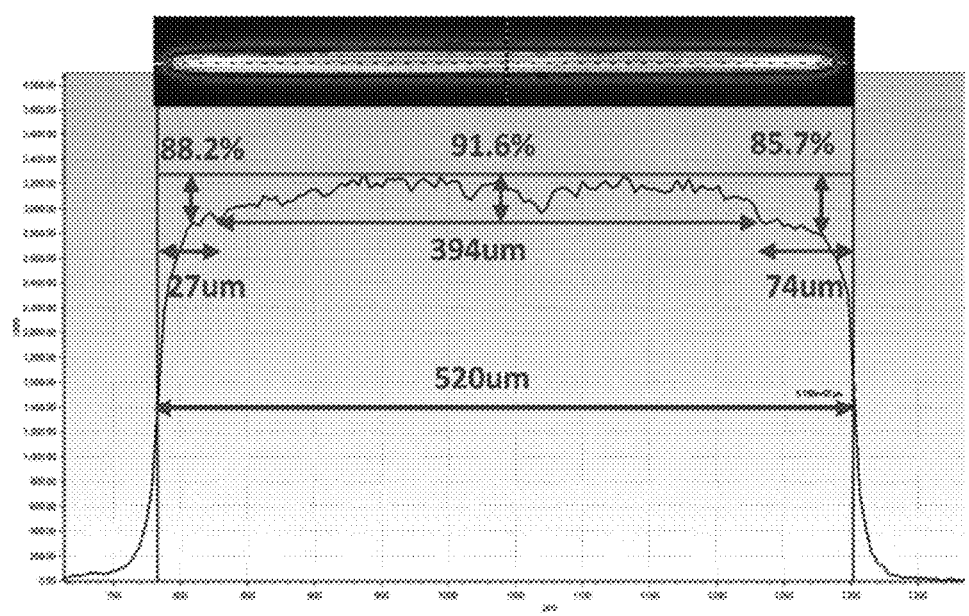
FIG. 8A is a graph showing an energy density distribution of a blue laser used in a first experimental example.

Now, a result of a first experimental example is described with reference to FIG. 8A and FIG. 8B. FIG. 8A is a graph showing an energy density distribution of a blue laser used in a first experimental example, and FIG. 8B is a photograph of a polycrystalline semiconductor surface formed by a first experimental example.

In the first experimental example, a buffer layer of about a 400 nm thickness was stacked on a glass substrate, an amorphous silicon layer of about a 50 nm thickness was stacked on the buffer layer, and the amorphous silicon layer was poly-crystallized by scanning the amorphous silicon layer by using a blue laser beam. The energy density distribution of the blue laser beam used in the first experimental example is shown in FIG. 8A, and a picture of a polycrystalline semiconductor layer in the first experimental example is shown in FIG. 8B.

The blue laser beam used in this experimental example was a line blue laser beam with a longitudinal and transverse width of about 520 μm and 20 μm, a maximum output was 11.44 W, a scan speed of the blue laser beam was 400 mm/s, the power density was 110 KW/cm$^2$, and the energy of the laser beam was about 5.5 J/cm$^2$. The uniformity of the blue laser beam, as shown in FIG. 8A, was about 91.6% in the center part and about 85% in the left and right edges.

Figure 8B:
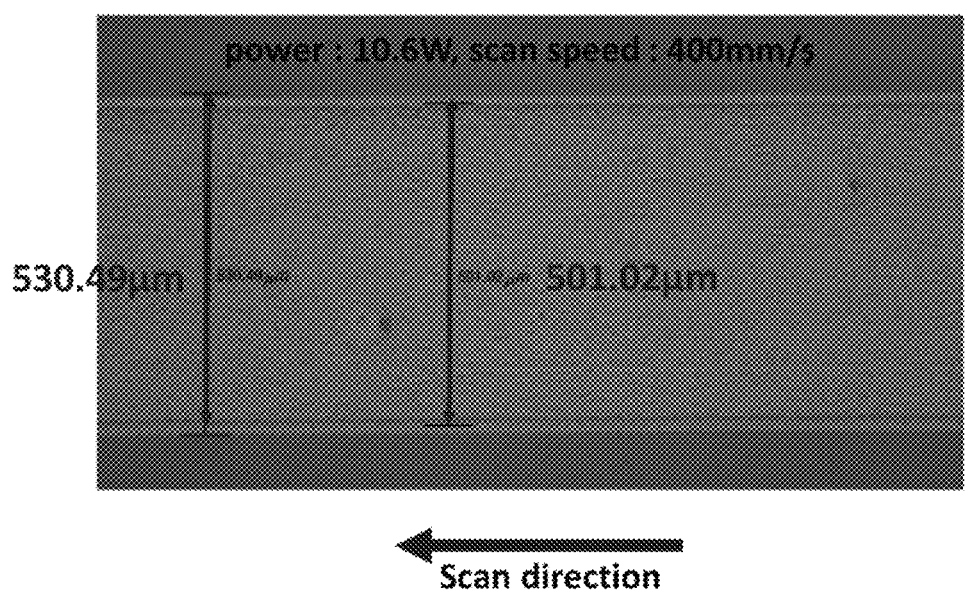
FIG. 8B is a photograph of a polycrystalline semiconductor surface of a first experimental example.

As a crystallization result by using the blue laser beam, as shown in FIG. 8B, it may be confirmed that the semiconductor layer was crystallized to have the width of about 501.02 μm and was crystallized to have the maximum width of 530.49 μm. In addition, it may be confirmed that the surface was generally smooth.

Figure 9A:
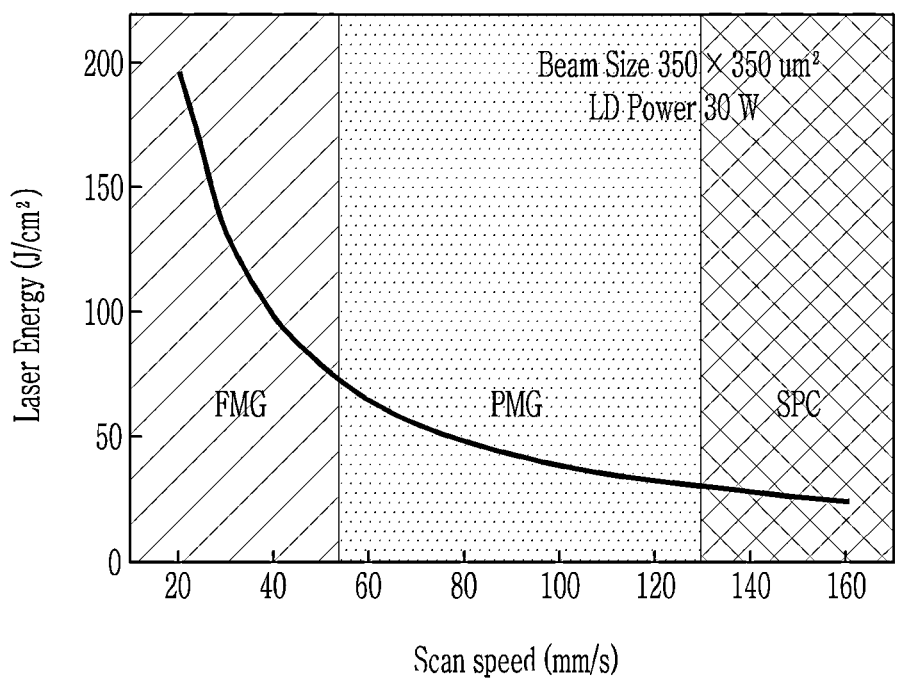
FIG. 9A and FIG. 9B are graphs showing a result according to a second experimental example.
Figure 9B:
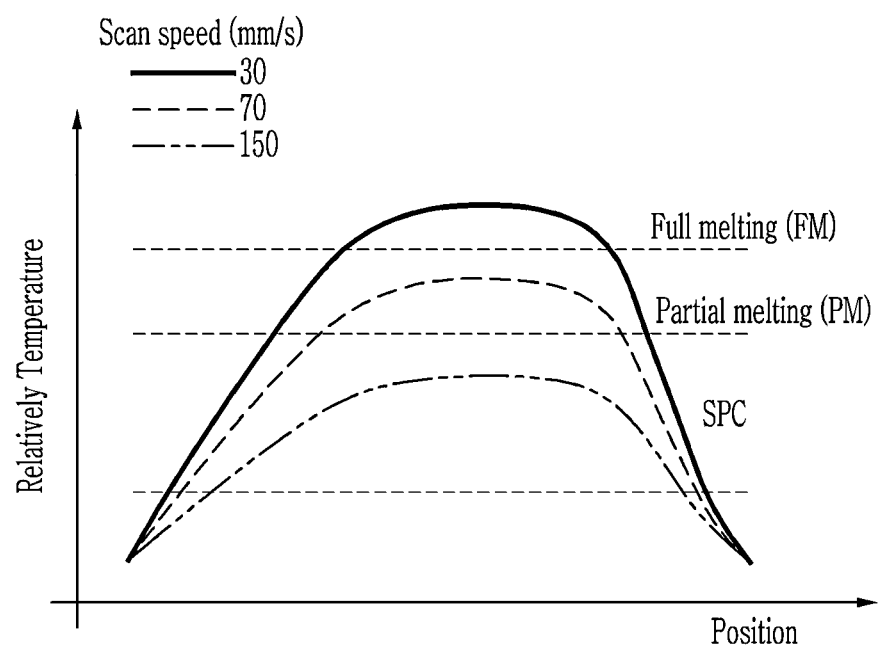

Now, a result of a second experimental example is described with reference to FIG. 9A and FIG. 9B. FIG. 9A and FIG. 9B are graphs showing a result according to a second experimental example.

In this experimental example, by using a blue laser beam with a size of about 350 µm in transverse and longitudinal directions while changing the scan speed, the blue laser energy was measured, and a relative temperature according to the irradiation of the blue laser beam was measured according to the position. The result of the blue laser energy is shown in FIG. 9A, and the relative temperature is shown in FIG. 9B.

The blue laser energy and the relative temperature were classified into the full melting crystallization region (FM), the partial melting crystallization region (PM), and a solid phase crystallization region (SPC), respectively.

Referring to FIG. 9A, when the scan speed of the blue laser beam is about 20 mm/s to about 50 mm/s, it may be seen that the amorphous silicon is completely melted and crystallized, resulting in the full melting crystallization, when the scan speed of the blue laser beam is about 50 mm/s to about 130 mm/s, it may be found that the partial melting crystallization in which the amorphous silicon was partially melted and crystallized was achieved, and when the scan speed of the blue laser beam is more rapid than about 130 mm/s, it may be found that the amorphous silicon was solid-crystallized (solid phase crystallization). As described above, when using the blue laser beam, it may be seen that the crystallization of the amorphous silicon is well performed even if the scan speed of the laser beam is relatively large.

Referring to FIG. 9B, except for some regions at the edge part of the blue laser beam, in most regions irradiated with the blue laser beam, it may be found that the crystallization of the amorphous silicon may be achieved well even when the scan speed is as fast as 150 mm/s.

The full melting crystallized grain size, the partial melting crystallized grain size, and the solid phase crystallized grain size may be different from each other.

As such, as in the exemplary embodiment, by the crystallization of the amorphous silicon by using the blue laser beam, even if scanning at a high speed, except for some regions of the edge portion of the blue laser beam, in most regions to which the blue laser beam is irradiated, it may be seen that the crystallization was performed.

Next, a third experimental example is described with reference to Table 1. In this experimental example, after differentiating the thickness of the amorphous silicon, under the same conditions, after forming the transistor by crystallizing the amorphous silicon by using the blue laser beam, a characteristic of the transistor was measured and a result thereof is shown in Table 1 below. At this time, the thickness of the amorphous silicon was about 50 nm and about 100 nm, and the channel length and the channel width of the transistor were 4 µm, respectively.

TABLE 1

| Characteristic | 50 nm | 100 nm |
| --- | --- | --- |
| Mobility (cm²/Vs) | 22.0 | 23.9 |
| Threshold voltage (Vth) (V) | −5.5 | −5.6 |
| Sub-threshold hole swing (SS) (V/dec) | 1.06 | 0.96 |

Figure 10A:
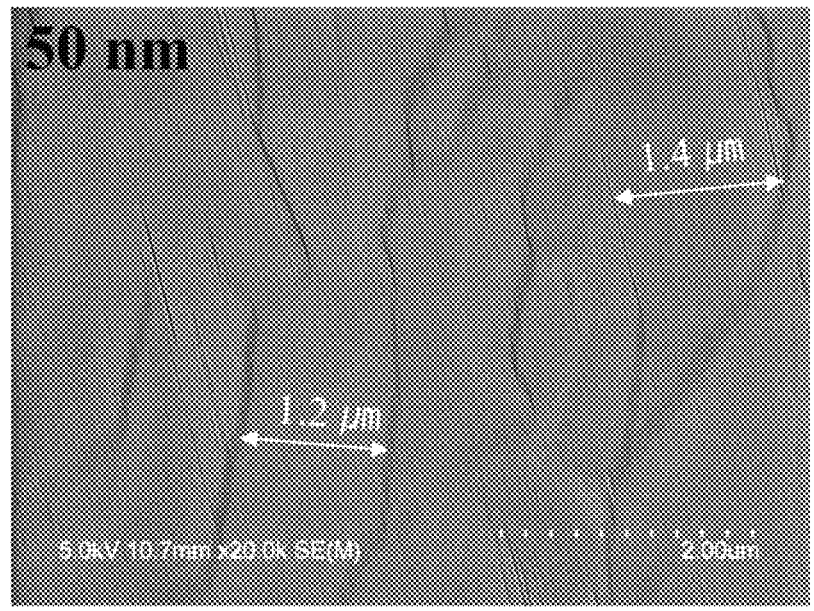
FIG. 10A to FIG. 10E show scanning electron microscope (SEM) pictures according to a third experimental example.
Figure 10B:
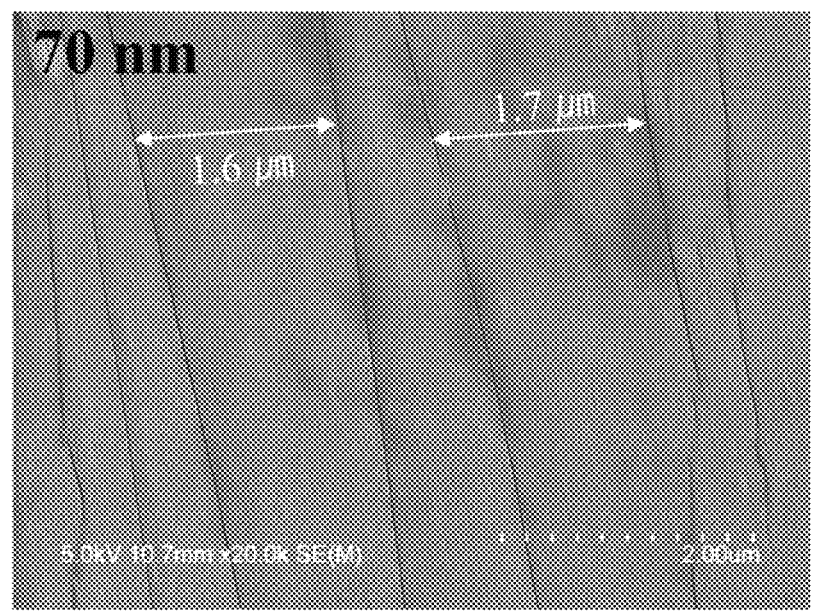
Figure 10C:
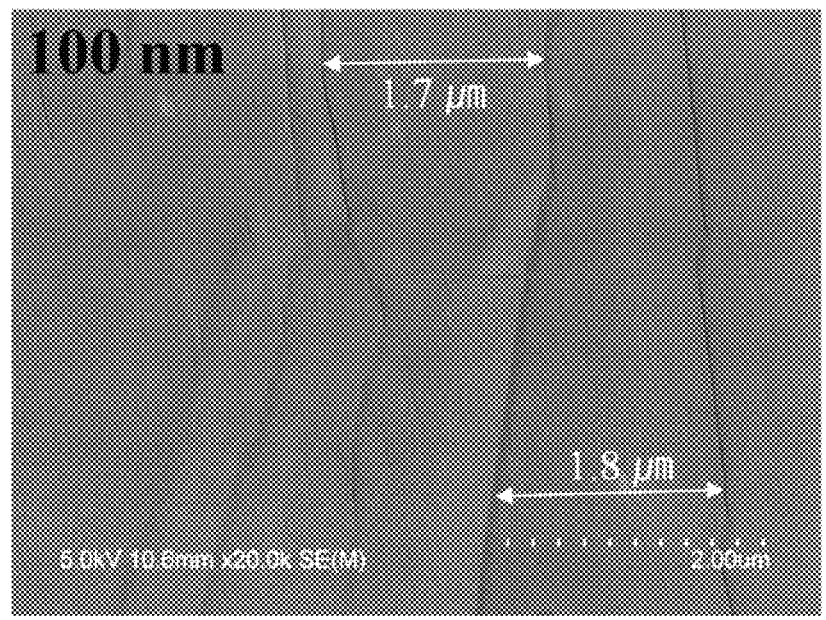
Figure 10D:
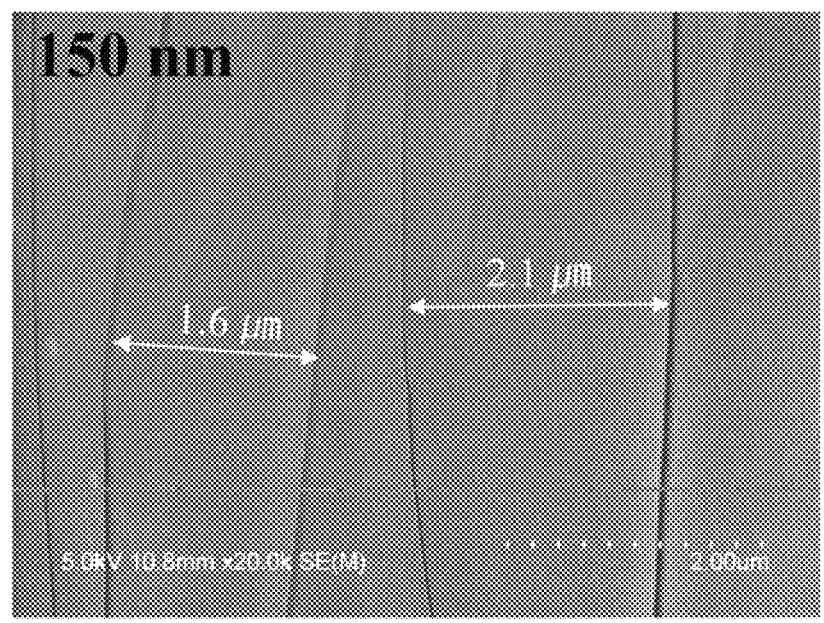
Figure 10E:
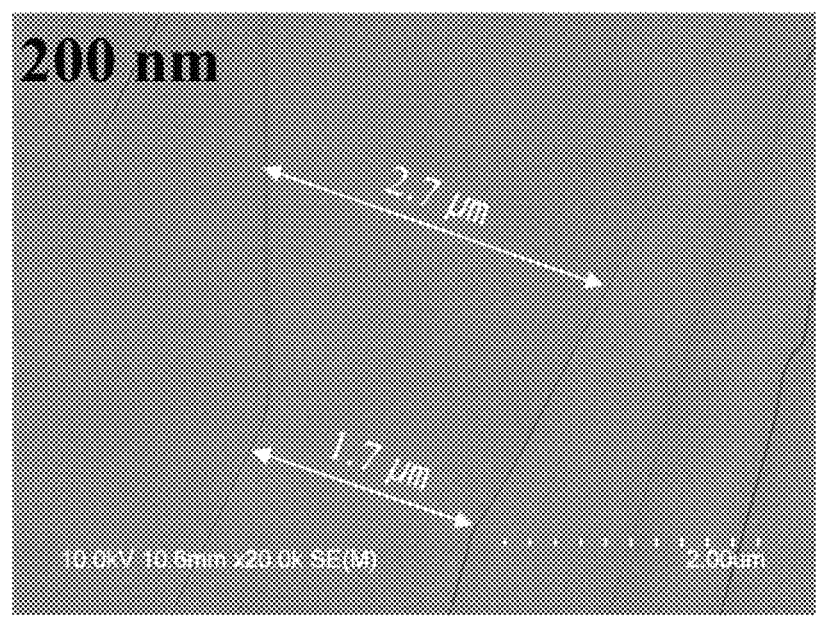
Figure 11A:
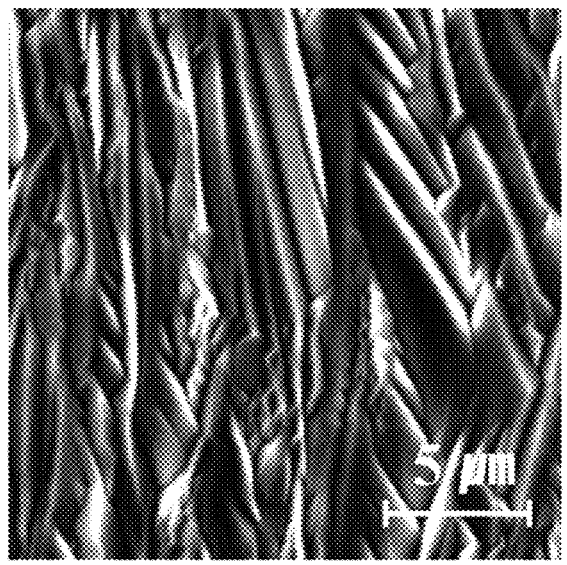
FIG. 11A to FIG. 11E show atomic force microscope (AFM) pictures according to a third experimental example.
Figure 11B:
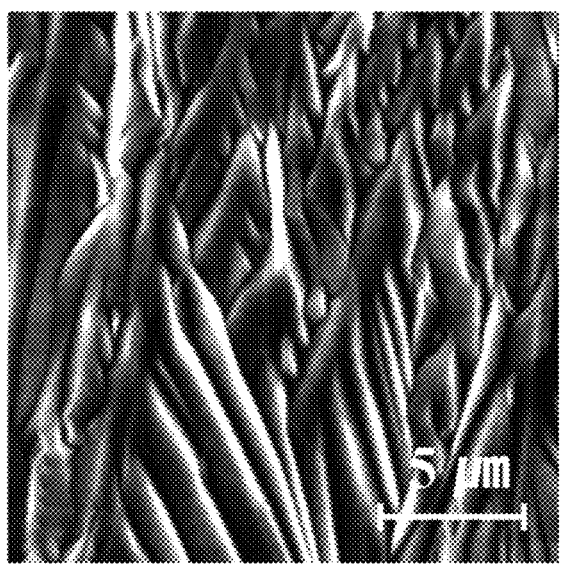
Figure 11C:
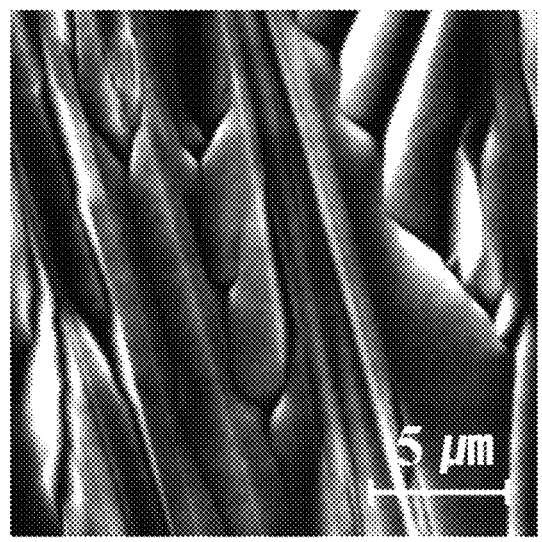
Figure 11D:
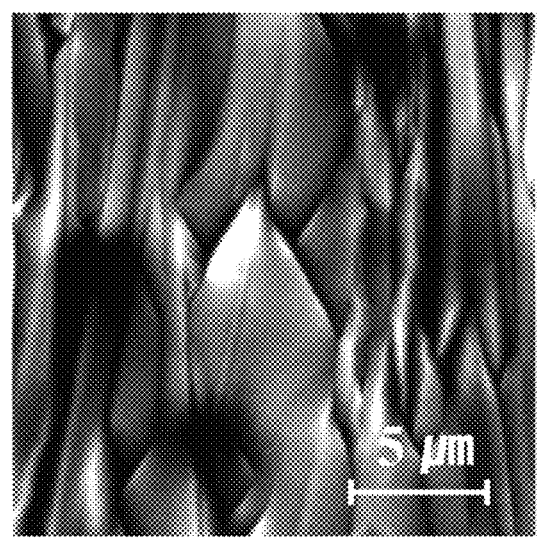
Figure 11E:
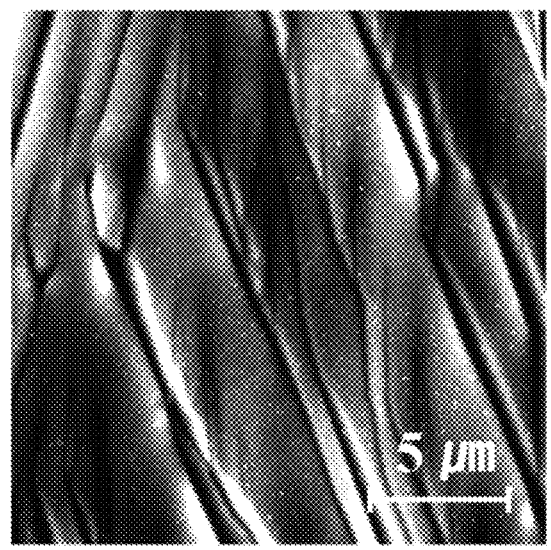

Referring to Table 1, since the absorption depth of the blue laser beam is sufficiently deep, the crystallization is well performed even when the amorphous silicon thickness is 100 nm compared to the case where the amorphous silicon thickness is 50 nm, and it may be confirmed that the characteristics of the transistor are similarly excellent. Next, a result of a third experimental example is described with reference to Table 2 and Table 3 along with FIG. 10A to FIG. 10E and FIG. 11A to FIG. 11E. FIG. 10A to FIG. 10E show scanning microscope (SEM) pictures according to a third experimental example, and FIG. 11A to FIG. 10E show atom force microscope (AFM) pictures according to a third experimental example.

In this experimental example, the amorphous silicon was stacked at the thickness of about 50 nm, about 70 nm, about 100 nm, about 150 nm, and about 200 nm, and then crystallized using the blue laser beam under the same conditions, and a grain size and a surface roughness were measured, respectively. The result of the grain size is shown in FIG. 10A to FIG. 10E and Table 2, the result of the surface roughness is shown in FIG. 11A to FIG. 11E and Table 3. In this experimental example, the amorphous silicon layer is crystallized through the full melting.

TABLE 2

| Semiconductor layer thickness (nm) | Average grain size (µm) |
| --- | --- |
| 50 | 1.3 |
| 70 | 1.5 |
| 100 | 1.8 |
| 150 | 1.9 |
| 200 | 2.2 |

TABLE 3

| Semiconductor layer thickness (nm) | Average grain size (µm) |
| --- | --- |
| 50 | 5.189 |
| 70 | 5.427 |
| 100 | 5.946 |
| 200 | 5.374 |

Referring to Table 1 together with FIG. 10A to FIG. 10E, it may be seen that the crystallization of the amorphous silicon is well performed even when the thickness of the semiconductor layer is 100 nm or more, and the average grain size, that is, the average value of the interval between the adjacent grain boundaries, is close to 2 µm when the thickness of the semiconductor layer is 100 nm or more. As such, like the thin film transistor and the manufacturing method thereof according to the exemplary embodiment, by crystallizing the semiconductor by using the blue laser beam, compared with the conventional excimer laser, it may be confirmed that the large grain size is crystallized. Referring to Table 2 along with FIG. 11A to FIG. 11E, even if the thickness of the semiconductor layer is changed, it may be confirmed that the surface roughness of the polycrystalline semiconductor layer has the value of 5 nm to 6 nm, and even if the thickness of the semiconductor layer is 100 nm or more, it may be confirmed that the value of the surface roughness of the polycrystalline semiconductor layer is not relatively large. As such, like the thin film transistor and the manufacturing method according to the exemplary embodiment, by crystallizing the semiconductor by using the blue laser beam, compared with the conventional excimer laser, it may be confirmed that the polycrystalline semiconductor layer was formed so that the surface roughness was not large so as to not have the large occurrence of the protrusions.

Next, a result of a fourth experimental example is described with reference to FIG. 12A to FIG. 12D. FIG. 12A to FIG. 12D are electron microscope pictures showing a result according to a fourth experimental example.

In a fourth experimental example, like the manufacturing method of the thin film transistor according to an exemplary embodiment, for a first case of crystallizing the amorphous silicon by the blue laser annealing method and a second case of crystallizing the amorphous silicon by the conventional excimer laser annealing method, the transistors were respectively formed and electron microscope pictures of a cross-section and an upper surface thereof are pictured in FIG. 12A to FIG. 12D. In the fourth experimental example, other conditions except for the crystallizing method of the amorphous silicon were are all the same.

Figure 12A:
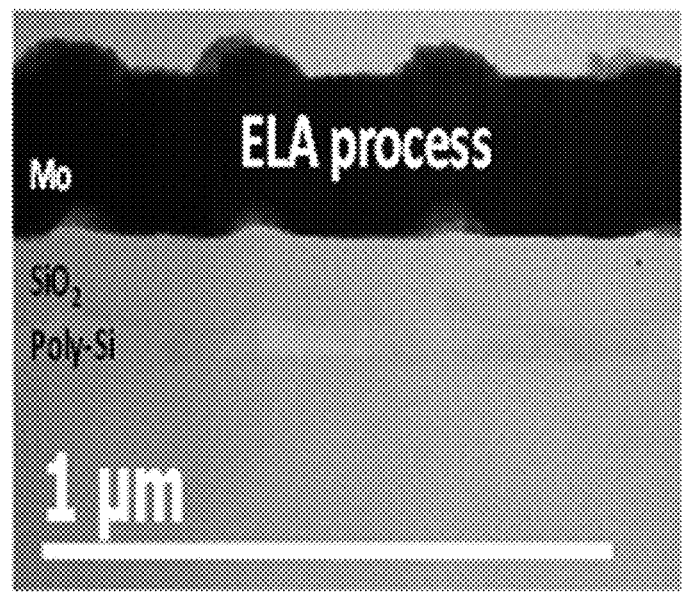
FIG. 12A to FIG. 12D are electron microscope pictures showing a result according to a fourth experimental example.
Figure 12B:
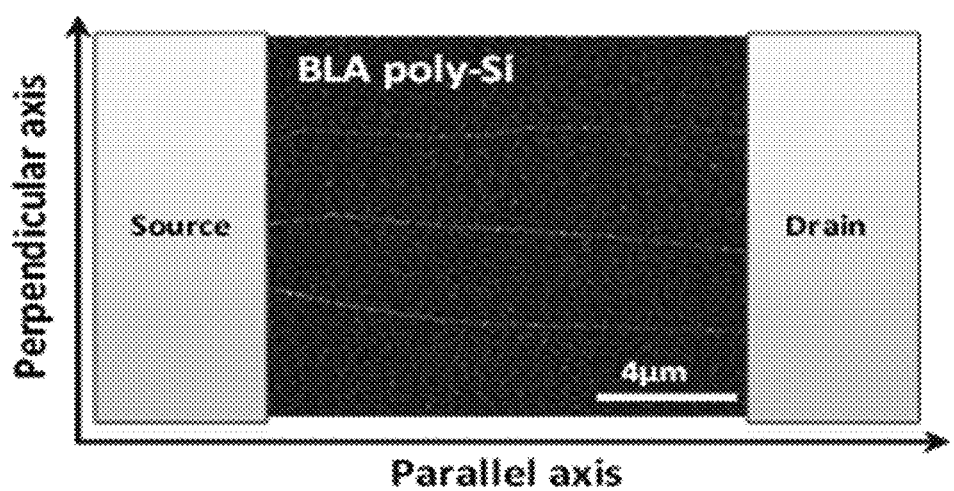
Figure 12C:
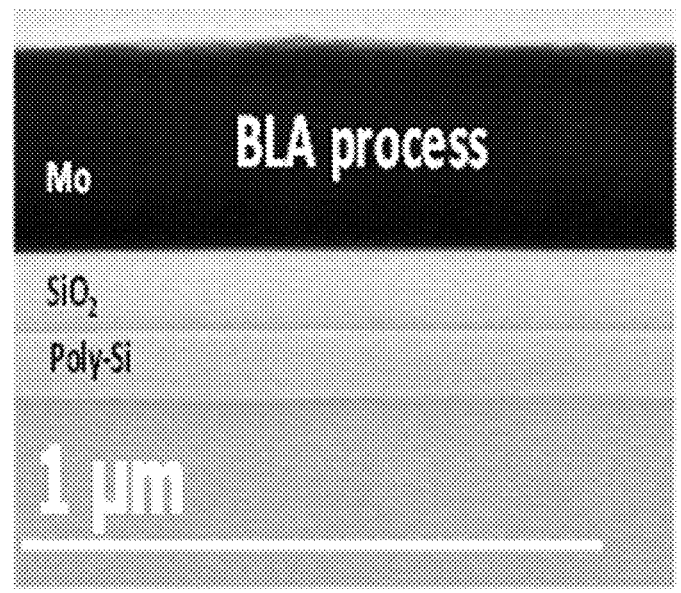

FIG. 12A and FIG. 12B are the pictures of the cross-section and the upper surface of the first case, and FIG. 12C and FIG. 12C are the pictures of the cross-section and the upper surface of the second case.

As shown in FIG. 12A and FIG. 12B, like the transistor manufacturing method according to the exemplary embodiment, according to the second case of crystallizing the amorphous silicon by the continuous-wave blue laser annealing, it may be confirmed that the protrusion is not formed on the surface of the polysilicon layer, and as a result, it may be confirmed that the protrusion was not formed on the surface of the insulation layer and the electrode layer formed thereon.

The grain boundary of the polysilicon extends in a direction (a parallel axis) parallel to a direction that is horizontal to the scan direction of the blue laser annealing, and the grain boundary extending along a direction (a perpendicular axis) parallel to a direction that is perpendicular to the scan direction of the blue laser annealing does not appear. In addition, it may be confirmed that the interval of the grain boundaries was about 4 μm. Further, it may be confirmed that the grain boundary was almost parallel to the channel length direction, and the angle formed by the grain boundary with the channel length direction of the transistor was within 30 degrees.

As such, like the transistor manufacturing method according to an exemplary embodiment, according to the second case of crystallizing the amorphous silicon by the continuous-wave blue laser annealing, it may be confirmed that the grain boundary extending along the direction almost parallel to the channel length direction is formed and the grain boundary extending in the direction almost parallel to the channel width direction does not appear.

Figure 12D:
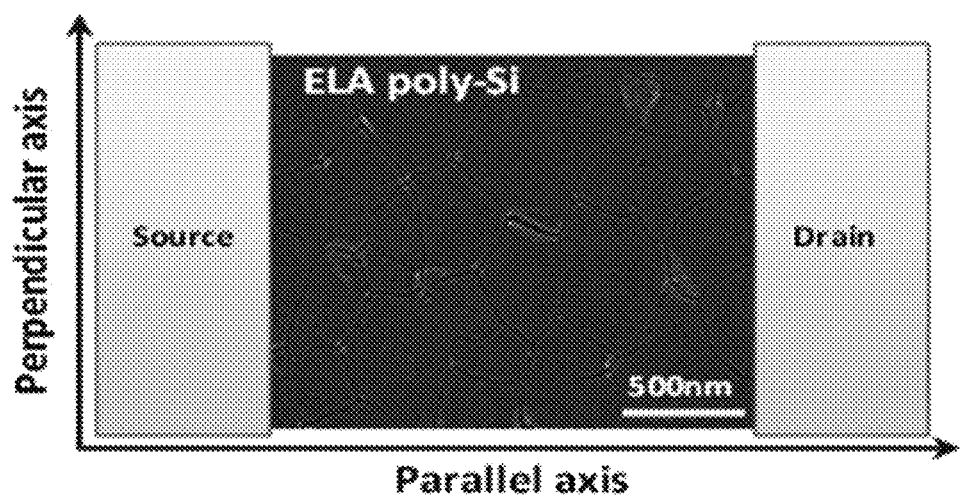

In contrast, referring to FIG. 12C and FIG. 12D, according to the second case of crystallizing amorphous silicon by the conventional excimer laser annealing method, a plurality of protrusions were formed on the surface of the polysilicon, and accordingly, it may be confirmed that the protrusions were also formed on the surface of the insulation layer and the electrode layer formed thereon. In addition, it may be confirmed that the grain boundaries of about 500 nm or less were irregularly formed, thereby the irregular and many protrusions were formed on the surface of the polysilicon.

Next, a result of a fifth experimental example is described with reference to FIG. 13A, FIG. 13B, FIG. 14A, FIG. 14B, FIG. 15A, FIG. 15B, and FIG. 15C. FIG. 13A, FIG. 13B, FIG. 14A, FIG. 14B, FIG. 15A, FIG. 15B, and FIG. 15C are electron microscope pictures showing a result of a fifth experimental example.

In the fifth experimental example, the thin film transistor was formed according to the manufacturing method of the thin film transistor according to the exemplary embodiment described with reference to FIG. 5A to FIG. 5I above, and result pictures as shown in FIG. 13A, FIG. 13B, FIG. 14A, FIG. 14B, FIG. 15A, FIG. 15B, and FIG. 15C. The width and the length of the channel of the transistor formed in the fifth experimental example were 40 μm and 4 μm, respectively.

Figure 13A:
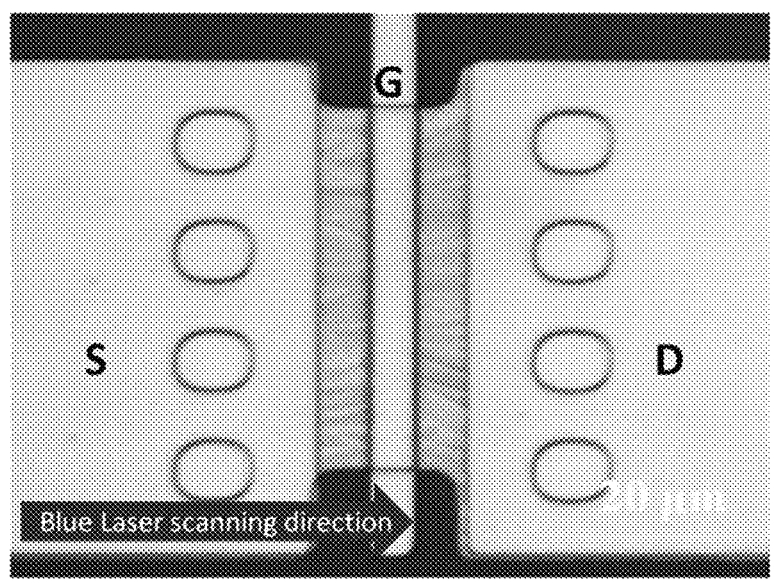
FIG. 13A, FIG. 13B, FIG. 14A, FIG. 14B, FIG. 15A, FIG. 15B, and FIG. 15C are electron microscope pictures of a result according to a fifth experimental example.
Figure 13B:
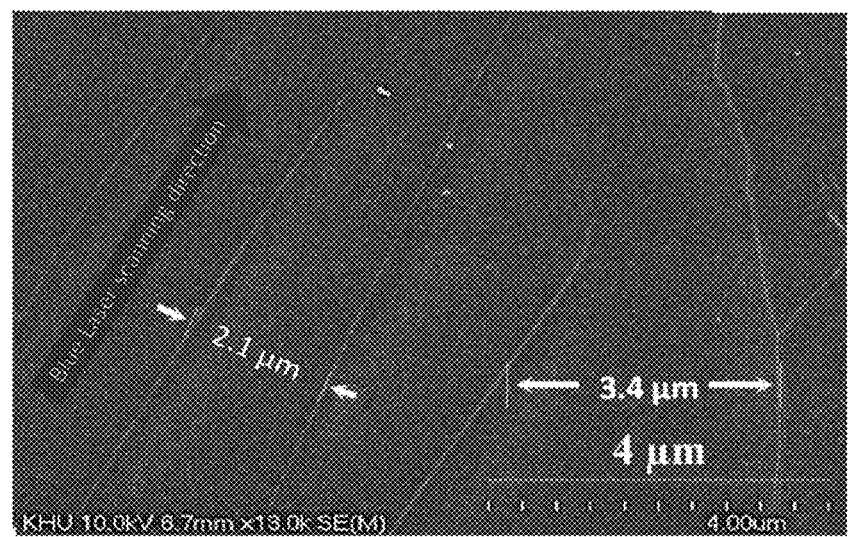

FIG. 13A shows an upper surface picture of the transistor formed in the second experimental example, and FIG. 13B shows a surface picture of the polysilicon of the channel region.

Referring to FIG. 13A and FIG. 13B, it may be confirmed that the interval of the grain boundaries of the channel region of the transistor was longer than 2 μm, the average particle width was about 3 μm, and the average particle length was about 10 μm. As such, it may be confirmed that there were not many grain boundaries in the channel region of the transistor manufactured according to the manufacturing method of the thin film transistor according to the exemplary embodiment. In addition, it may be confirmed that the grain boundary was almost parallel to the channel length direction, and the angle (θ) formed by the grain boundary with the channel length direction of the transistor was within 30 degrees.

Figure 14A:
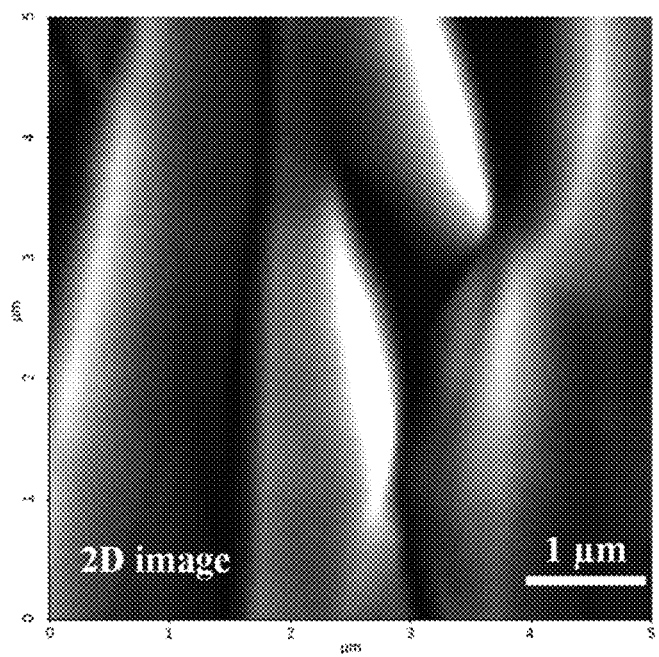
Figure 14B:
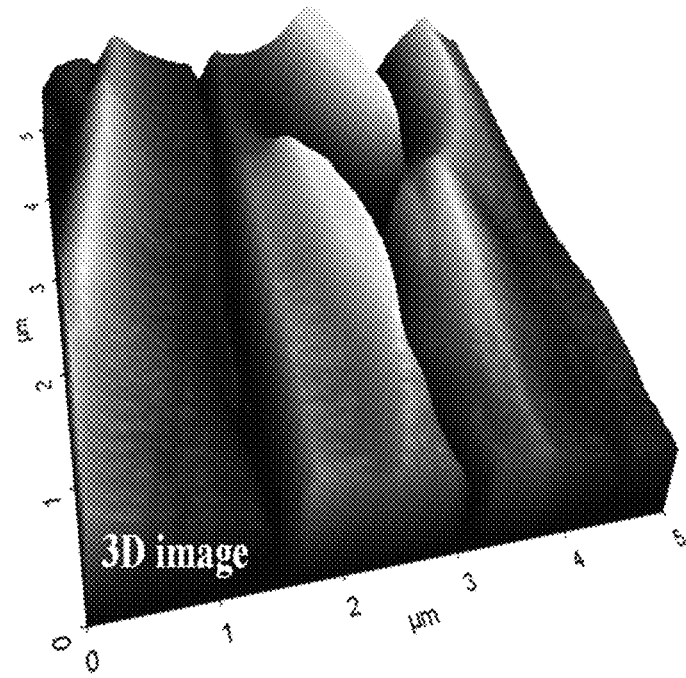

FIG. 14A shows a scanning electron microscope (SEM) picture of a channel region of a transistor manufactured in the fifth experimental example, and FIG. 14B shows an atomic force microscope (AFM) picture. Referring to FIG. 14A and FIG. 14C, it may be confirmed that the grain boundary was generated to be long along the blue laser annealing scan direction, and the root average squared roughness ($R_{RMS}$) measured in this experimental example was 5.58 nm. It may be confirmed that there was no grain boundary extending in the direction perpendicular to the blue laser annealing scan direction. Therefore, when the blue laser annealing is performed in the channel length direction, it may be seen that there is no grain boundary extending along the channel width direction.

Figures 15A, 15B:
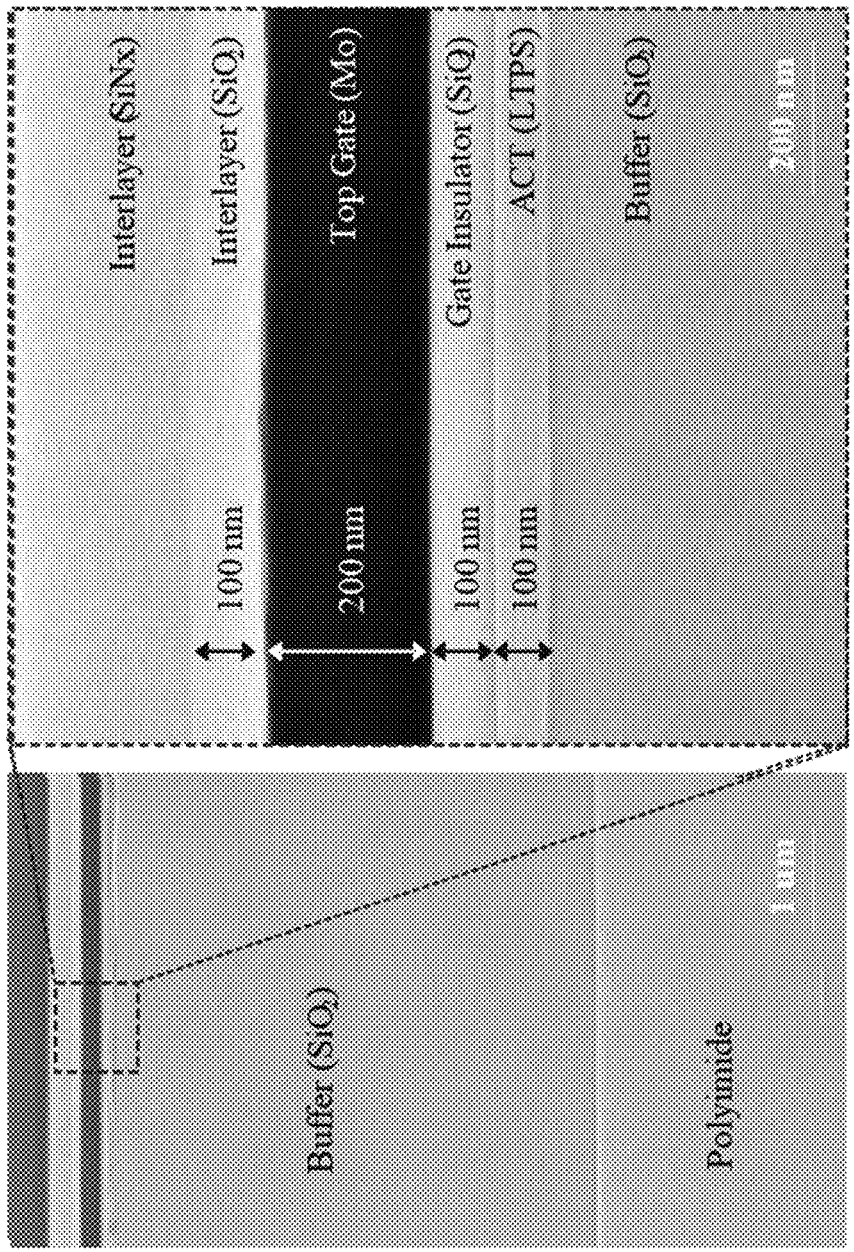
Figure 15C:
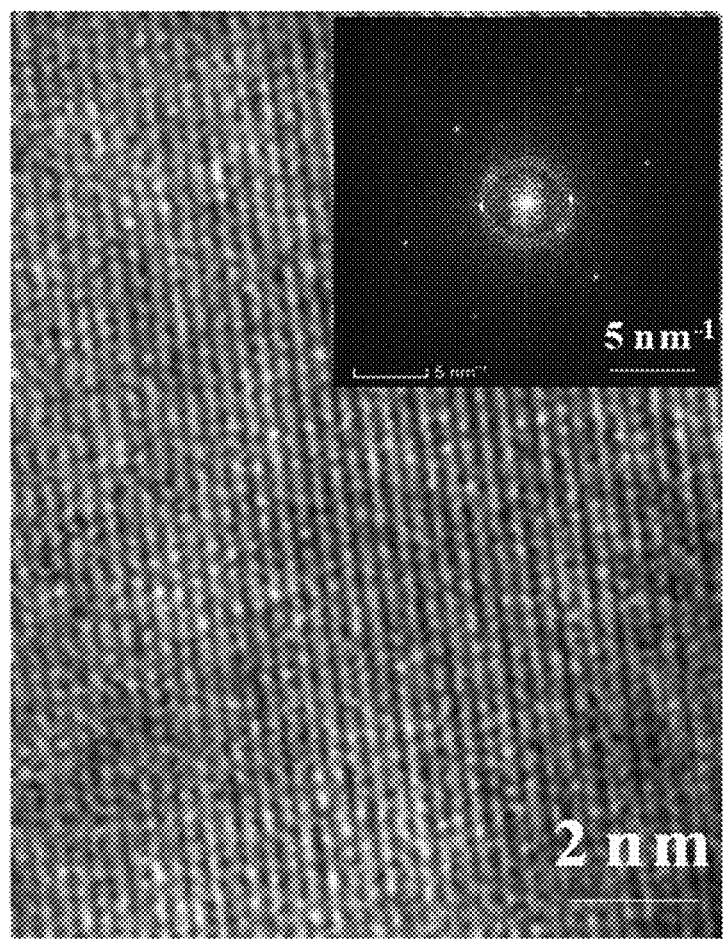

FIG. 15A shows a transmission electron microscope (TEM) picture for a cross-section of the transistor manufactured in the fifth experimental example, FIG. 15B is an enlarged picture of a part of FIG. 15A, and FIG. 15C is a transmission electron microscope picture of a selected area electron diffraction (SAED) pattern of the channel region.

Referring to FIG. 15A and FIG. 15B, even when the substrate is a plastic substrate such as a polyimide, the thickness of the buffer layer is relatively large, so that it may be confirmed that the transistor is formed without the damage to the substrate due to heat generated during the annealing and each layer formed thereon is also well formed without the surface protrusion. Also, referring to FIG. 15C, it may be seen that a single crystal characteristic appears in the channel region.

Figure 16:
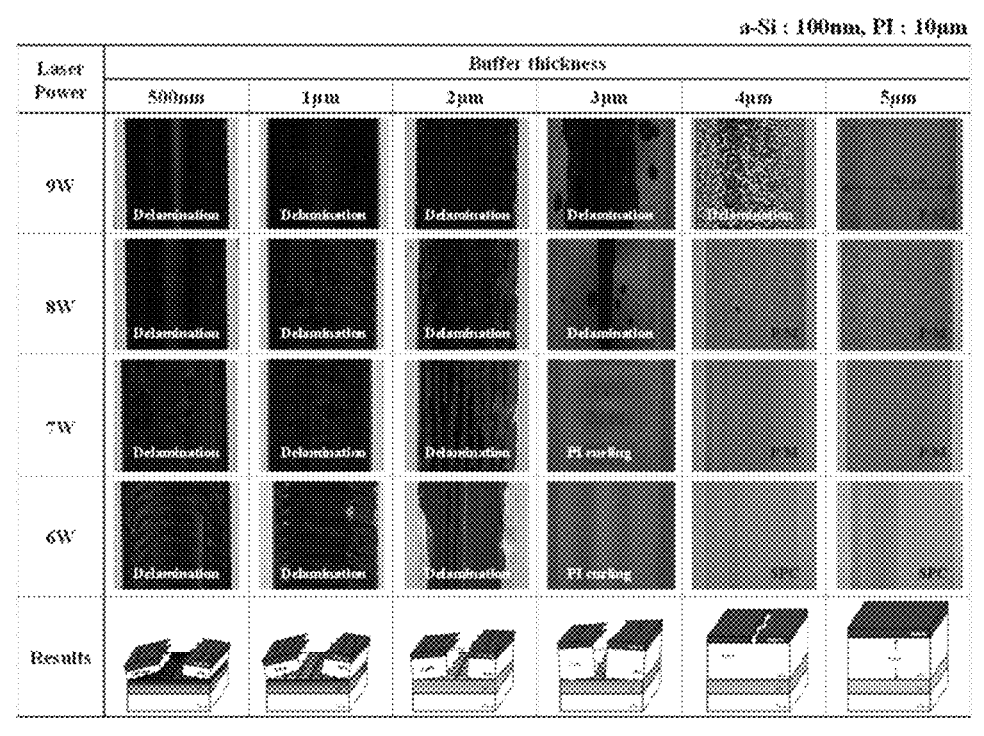

Next, a result of the sixth experimental example is described with reference to FIG. 16. FIG. 16 is an electron microscope picture showing a result of a sixth experimental example.

In the sixth Experimental Example, a buffer layer with a thickness of about 500 nm, about 1 μm, about 2 μm, about 3 μm, about 4 μm, and about 5 μm was respectively formed on a plastic substrate containing a polyimide with a thickness of about 10 μm, and an amorphous silicon was stacked on each buffer layer, and then the amorphous silicon was crystallized by the blue laser annealing while changing the intensity of the continuous-wave blue laser to 9 W, 8 W, 7 W, and 6 W, and an electron microscope picture for each case was taken and is shown in FIG. 11.

Referring to FIG. 16, even when the substrate is a plastic substrate such as a polyimide, by adjusting the thickness of the buffer layer between the substrate and the semiconductor layer, it may be confirmed that the substrate surface was not damaged or the buffer layer was not peeled off from the substrate surface by the annealing.

Figure 17:
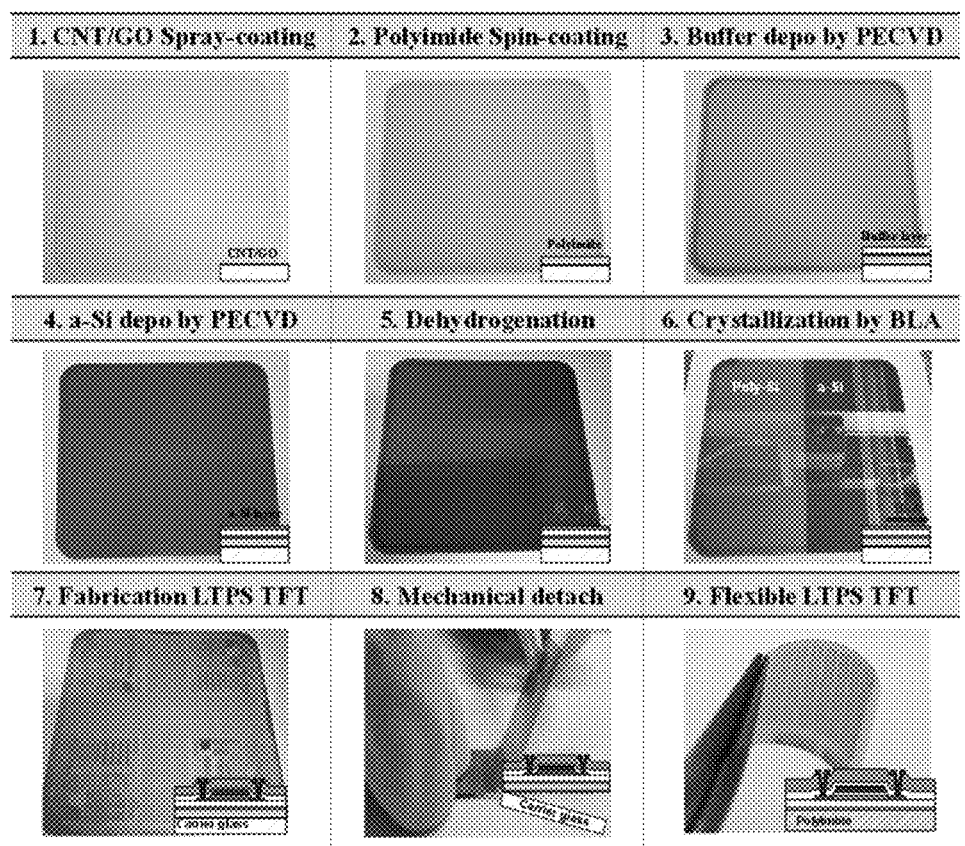
FIG. 17 is an electron microscope picture showing a result according to a seventh experimental example.

Next, a result of a seventh experimental example is described with reference to FIG. 17. FIG. 17 is an electron microscope picture showing a result of a seventh experimental example.

In the seventh experimental example, the thin film transistor was formed according to the manufacturing method of the thin film transistor according to the exemplary embodiment described with reference to FIG. 5A to FIG. 5I above, and the electron microscope picture was taken in each step and shown in FIG. 17.

Specifically, in this experimental example, a semiconductor layer was formed in an area of 150×150 mm².

Referring to FIG. 17, a substrate including a polyimide is formed on a supporting substrate, a buffer layer is formed, an amorphous silicon layer is stacked and crystallized by blue laser annealing to form a semiconductor layer including polysilicon, a gate insulation layer is formed thereon, a control electrode is formed, an input region and an output region are formed, an input electrode and an output electrode are formed to complete a transistor, the supporting substrate is removed from the substrate, and then the substrate including the transistor is bent, and here, it may be confirmed that the transistor was not separated from the substrate and was well formed. As described above, according to the thin film transistor manufacturing method according to the exemplary embodiment, it may be confirmed that the thin film transistor was formed well without the damage to the substrate including a polyimide. Particularly, even when the area of the semiconductor layer was formed as wide as 150×150 mm², it may be confirmed that the thin film transistor was well formed without damage to the substrate.

Next, a fifth experimental example is described with reference to FIG. 18A to FIG. 18E. FIG. 18A to FIG. 18E shows graphs showing a result of an eighth experimental example.

In the eighth experimental example, after forming the thin film transistor according to the thin film transistor and the manufacturing method thereof according to the exemplary embodiment, the characteristics of the transistor were measured in various ways and the results are shown in FIG. 18A to FIG. 18E as graphs.

Figure 18A:
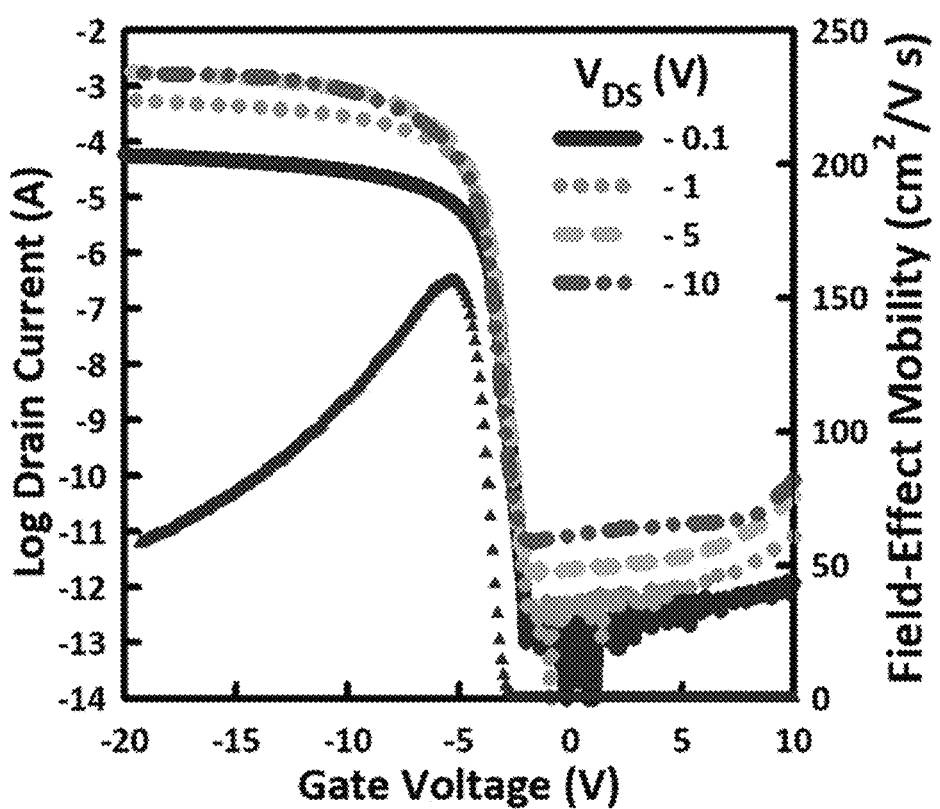
FIG. 18A to FIG. 18E are electron microscope pictures of a result according to an eighth fifth experimental example.

First, the thin film transistor was turned on while changing a drain-source voltage ($V_{DS}$) value, and the characteristic of the thin film transistor was measured and the result thereof is shown in FIG. 18A as a graph. Referring to FIG. 18A, according to the thin film transistor and the manufacturing method thereof according to the exemplary embodiment, it may be confirmed that the mobility was excellent and a leakage current was low. Though the result of FIG. 18A, it may be confirmed that the transistor had the threshold voltage ($V_{th}$) of −2.7 V, the threshold field effect mobility (μFE) of 153 cm²V−1s−1, and the sub-threshold hole swing (SS) value had an excellent characteristic of 0.2 V/dec.

Figure 18B:
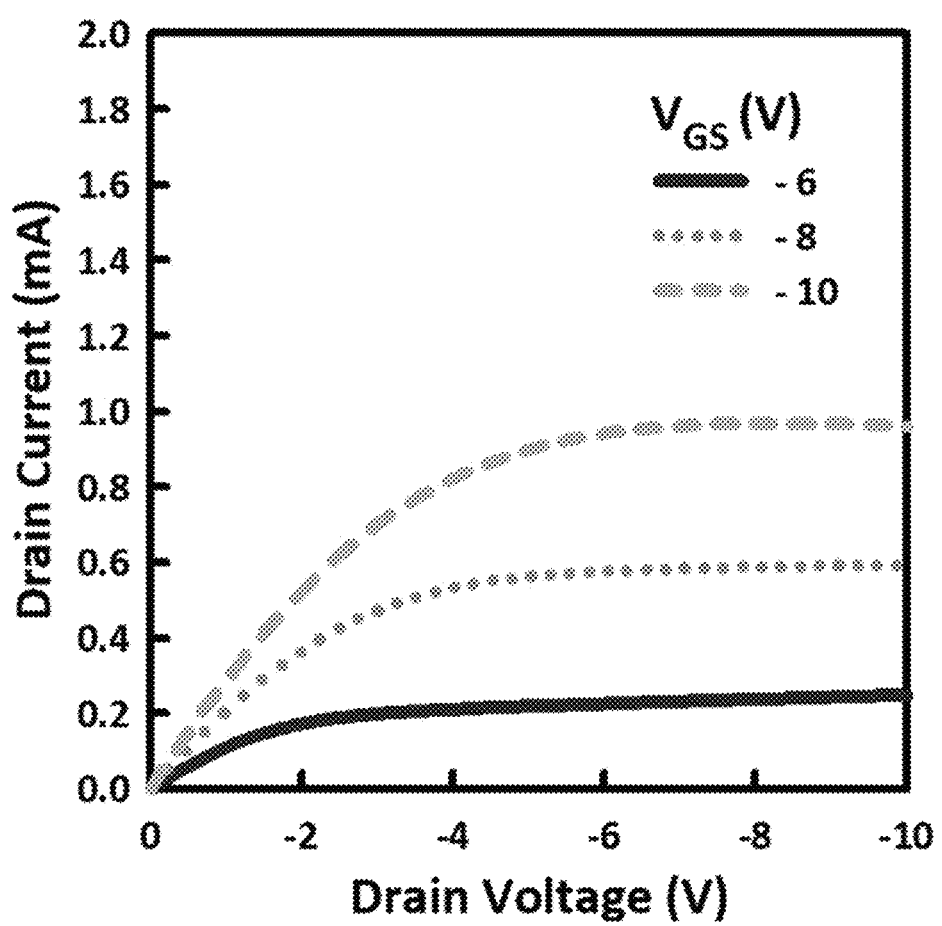

Next, a drain voltage of the thin film transistor was measured while changing a gate-source voltage VGS, and the result is shown in FIG. 18B. Referring to FIG. 18B, according to the thin film transistor and the manufacturing method thereof according to the exemplary embodiment, it may be confirmed that an excellent output characteristic was obtained and saturation was well formed without a kink effect.

Figure 18C:
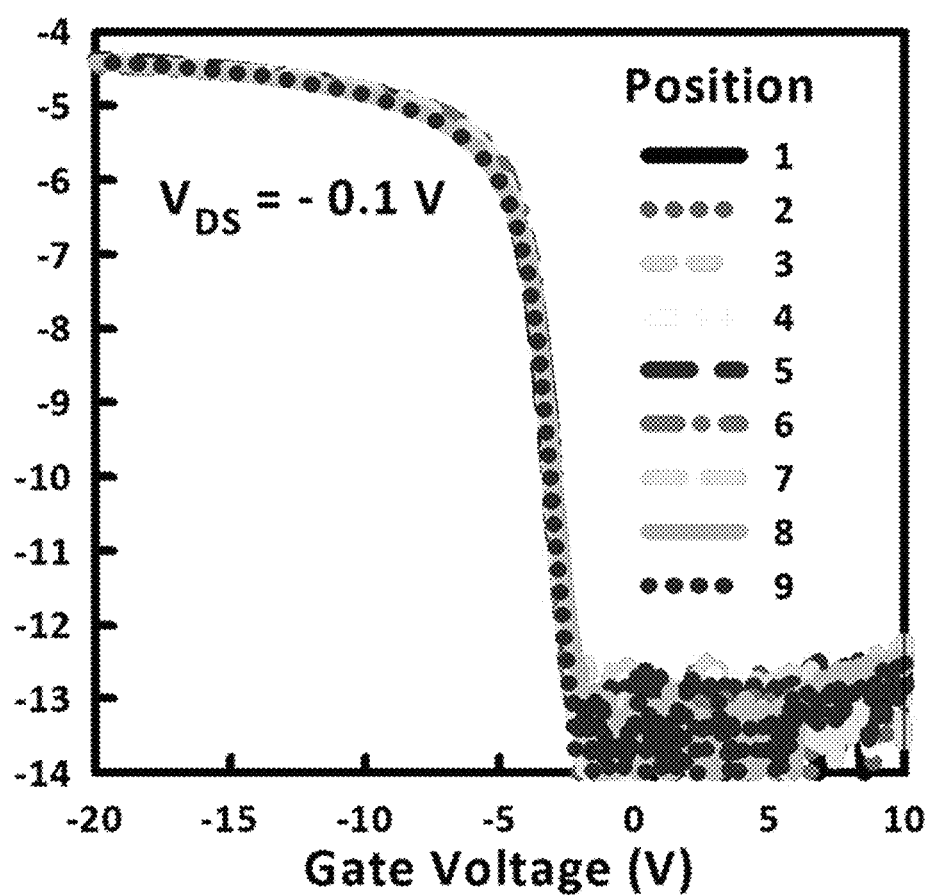

The performance of a plurality of transistors disposed at nine positions of the substrate having a longitudinal and transverse length of about 150 mm was evaluated and the results are shown in FIG. 18C. Referring to FIG. 18C, according to the thin film transistor and its manufacturing method according to an exemplary embodiment, it may be seen that the difference in characteristics of the transistors disposed in a plurality of regions on the substrate is not large. In detail, through the result of FIG. 18C, it may be confirmed that the channel region of the transistor had—the threshold voltage ($V_{th}$) value distribution of −2.7 V, the threshold field effect mobility (μFE) value distribution of 153 cm²V−1s−1, and the sub-threshold hole swing (SS) value distribution of 0.2±0.1 V/dec. As such, it may be seen that it has a uniform characteristic according to the position.

Figure 18D:
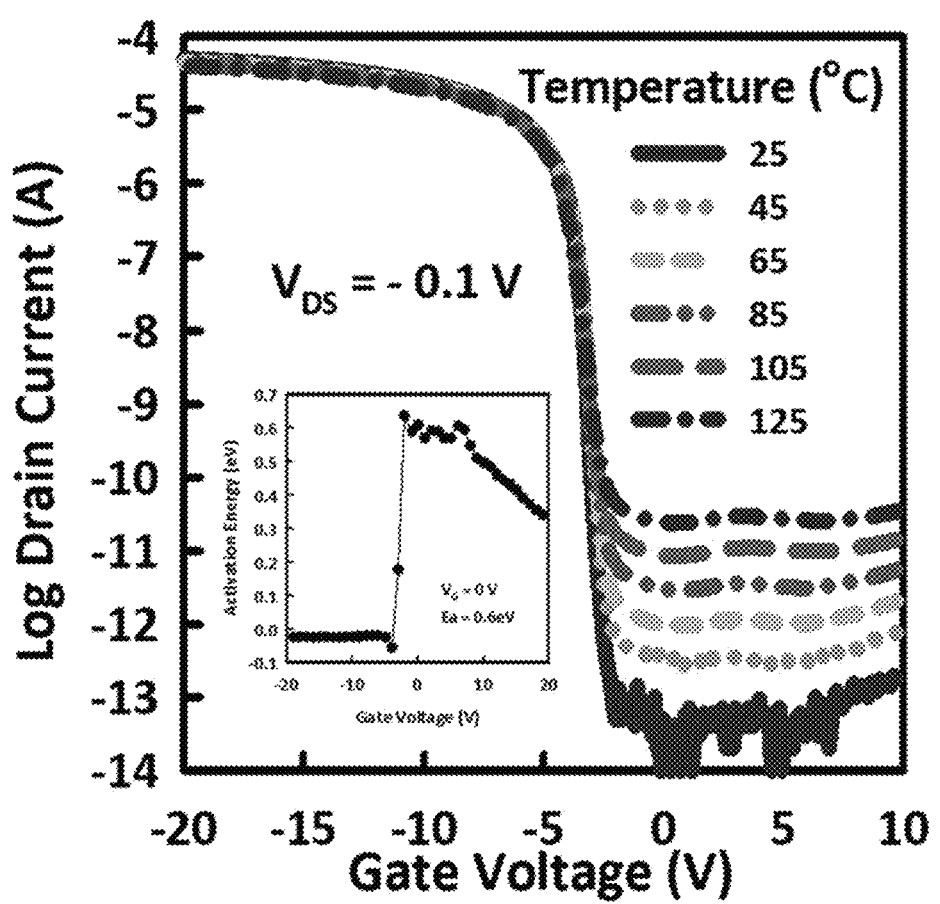

Next, the characteristic of the transistor was measured while changing the temperature between 25° C. and 125° C., and the results are shown in FIG. 18D. Referring to FIG. 18D, it may be seen that the ON/OFF operation is well performed according to the gate voltage (V) value, and it may be seen that the value of the off current has a constant value until the gate voltage (V) value is about 10 V.

Figure 18E:
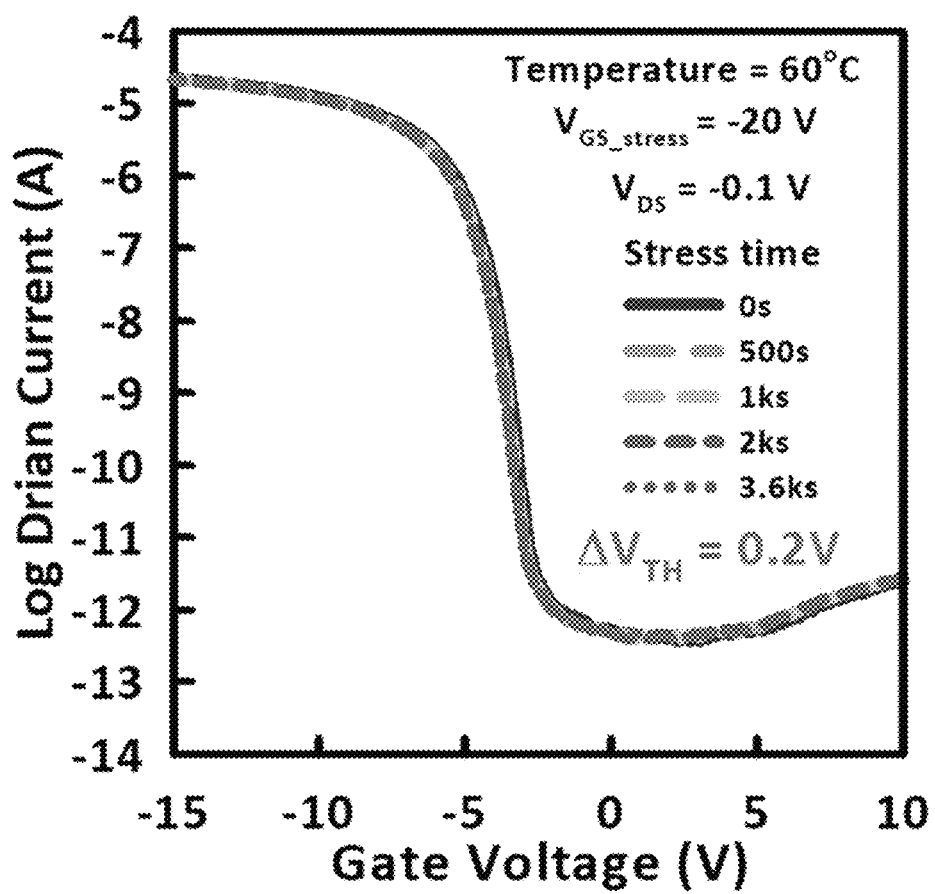

Also, under the 60° C. temperature, with a state of the gate-source voltage VGS value of −20 V, a negative bias temperature stress (NBTS) was applied for 1 hour and then the characteristic change was measured and the result is shown in FIG. 18E. Referring to FIG. 18E, it may be confirmed that a deviation of the threshold voltage ($V_{th}$) value was not large even under the negative bias temperature stress, and it may be confirmed that the deviation of the threshold voltage value was only about 0.2 V from the result of FIG. 18E.

Figure 19A:
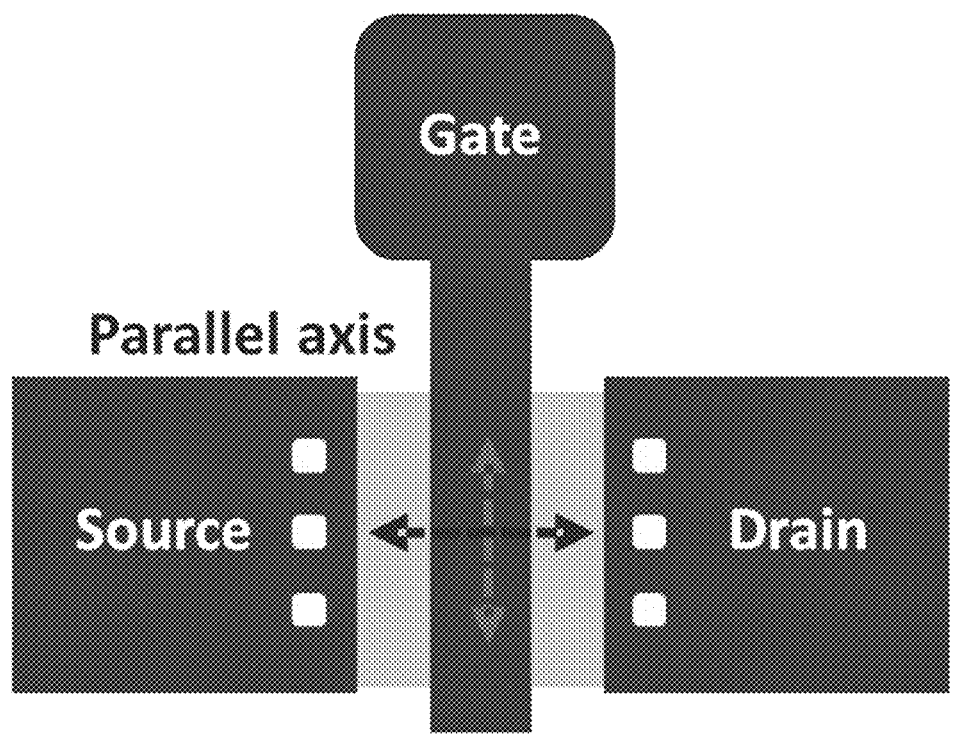
FIG. 19A and FIG. 19B are a conceptual diagram and an electron microscope picture to explain an experimental method of a ninth experimental example.
Figure 19B:
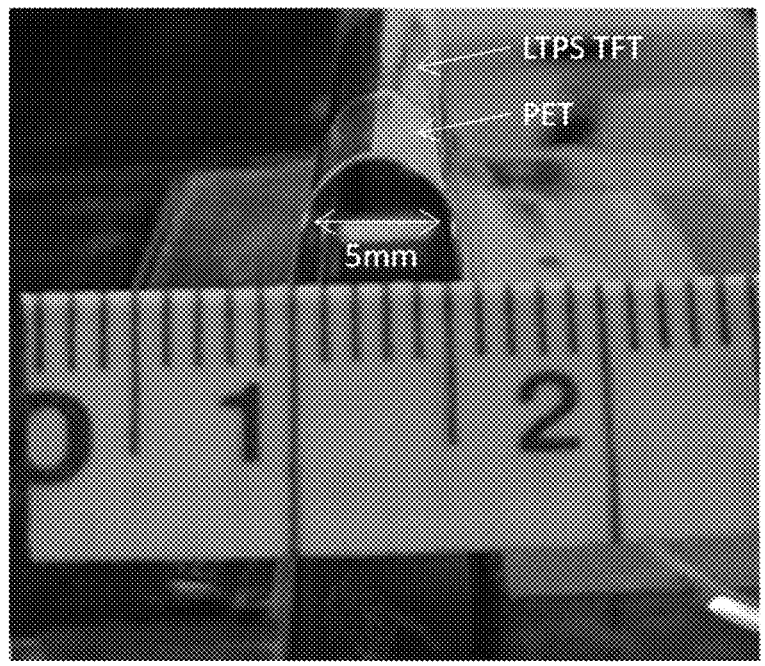

Next, a ninth experimental example is described with reference to FIG. and FIG. 21 along with FIG. 19A and FIG. 19B. FIG. 19A and FIG. 19B are a conceptual diagram and an electron microscope picture to explain an experimental method of a ninth experimental example, and FIG. 20 and FIG. 21 are graphs showing results according to a ninth experimental example.

First, a method of proceeding a ninth experimental example is described with reference to FIG. 19A and FIG. 19B.

As shown in FIG. 19A, in the ninth experimental example, the transistor was respectively formed for a third case of crystallizing the amorphous silicon by a conventional excimer laser annealing method and a fourth case of crystallizing the amorphous silicon by the blue laser annealing method according to the manufacturing method of the thin film transistor according to an exemplary embodiment. A folding operation was repeated along a first direction D1 parallel to the channel length direction of each formed transistor and a second direction D2 parallel to the channel width direction of the transistor. In the ninth experimental example, except for the crystallizing method of the amorphous silicon, other conditions are all the same.

In detail, like the picture shown in FIG. 19B, while repeating the folding operation 30,000 times so that the transistor has a radius of 2.5 mm in the first direction D1 and the second direction D2, the characteristic of the transistor was measured, and the results are shown in FIG. 20 and FIG. 21.

Figure 20A:
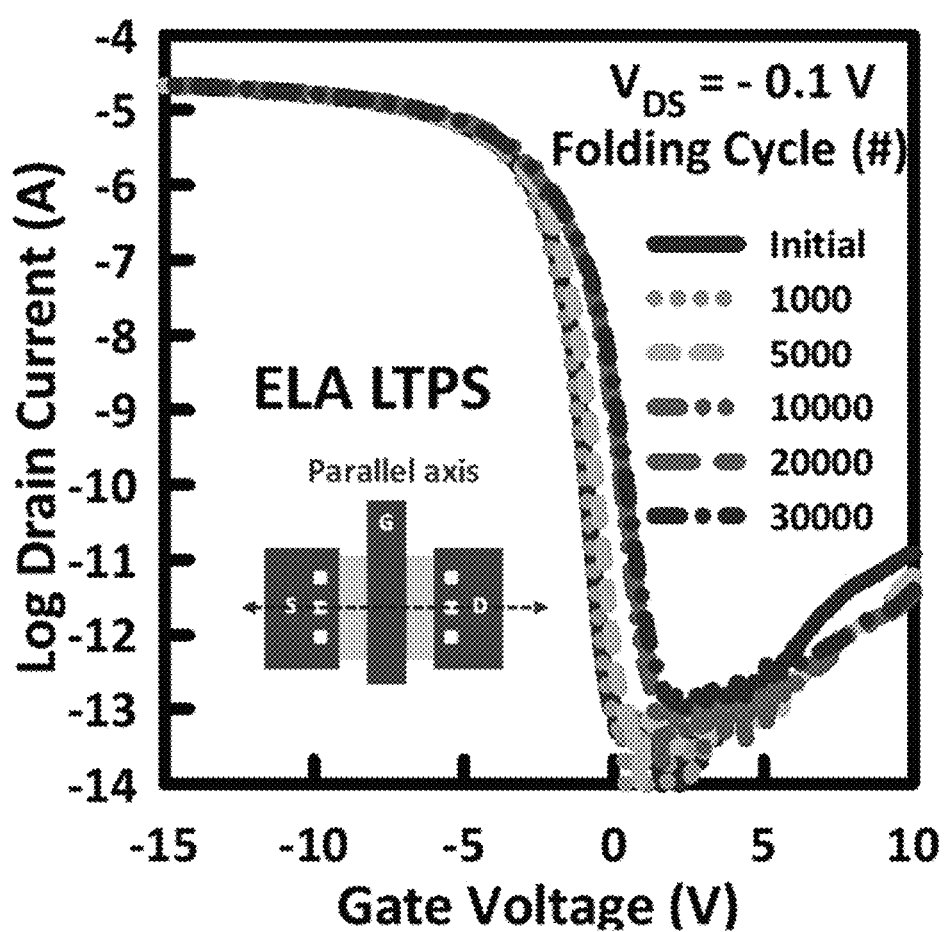
FIG. 20A, FIG. 20B, FIG. 21A, and FIG. 21B are graphs showing a result according to a ninth experimental example.
Figure 20B:
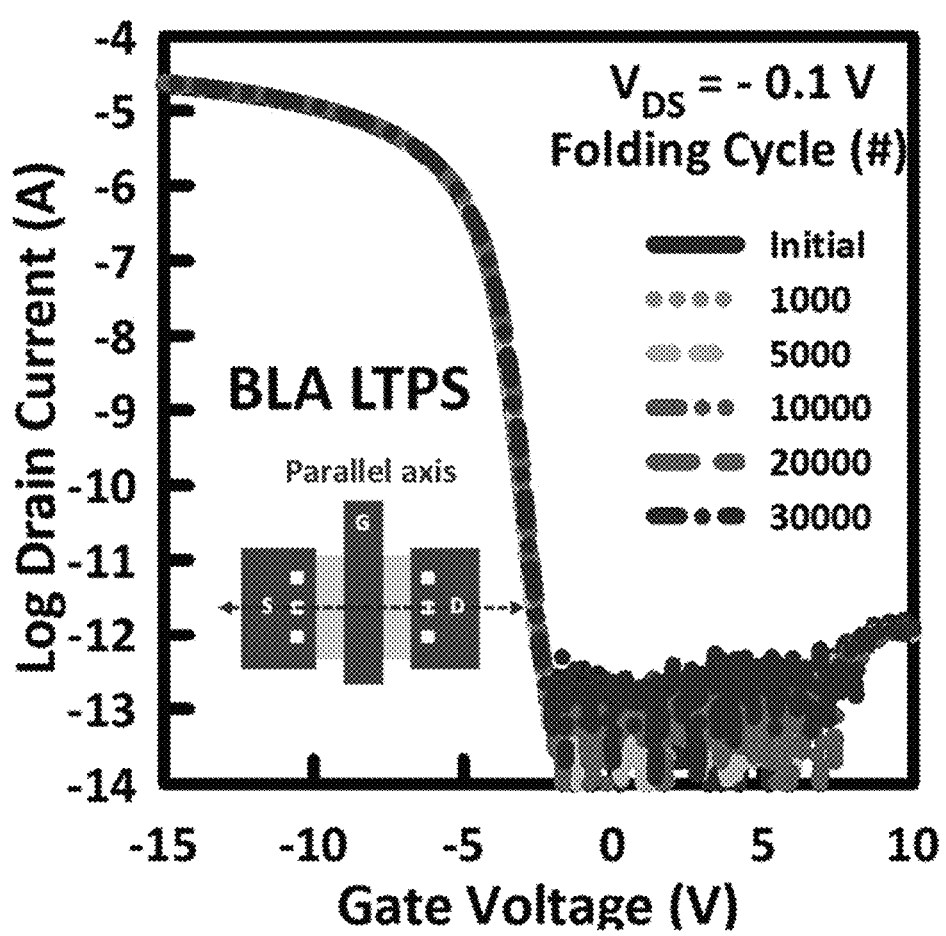
Figure 21A:
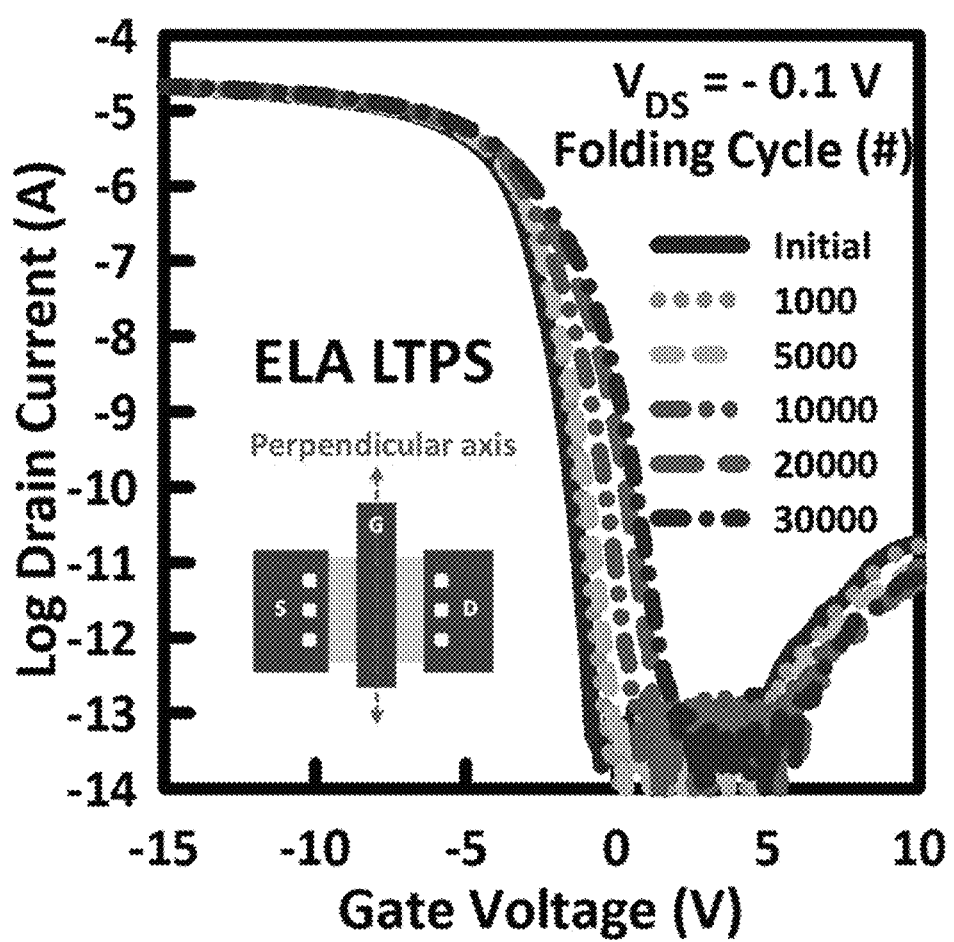
Figure 21B:
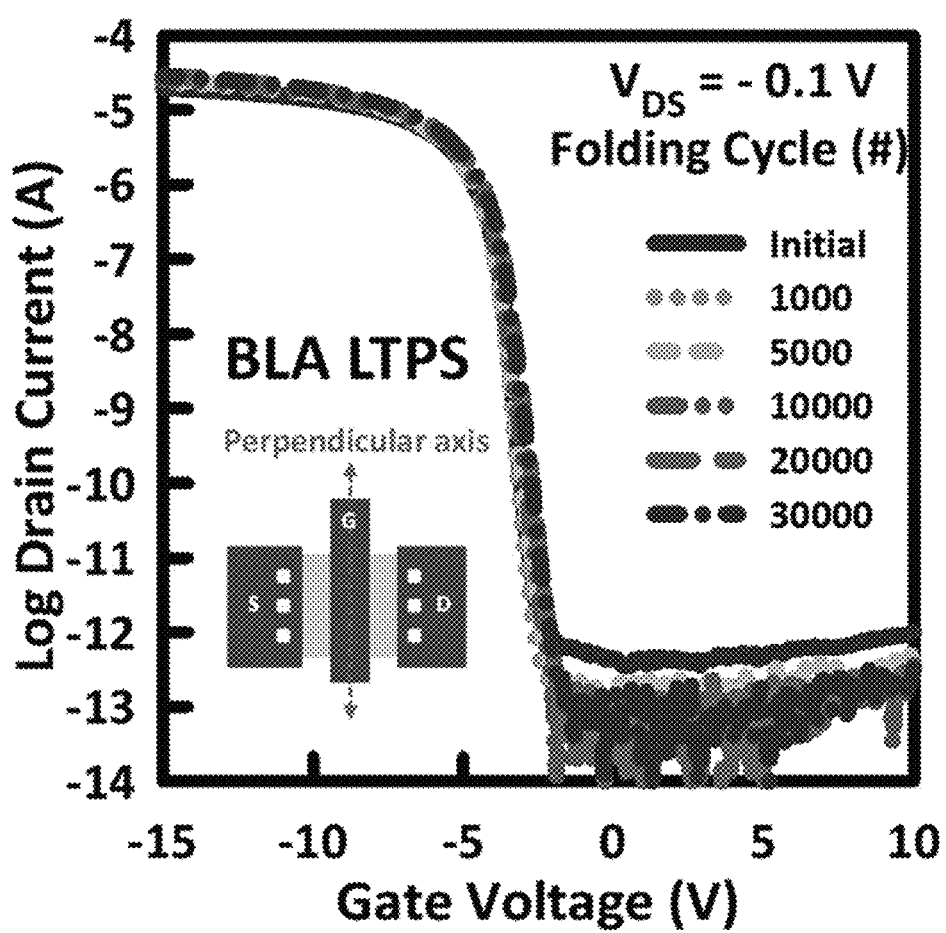

FIG. 20A and FIG. 20B shows the result of applying the folding operation in the first direction D1, and FIG. 21A and FIG. 21B shows the result of applying the folding operation in the second direction D2.

FIG. 20A shows the result of the third case, and FIG. 20B shows the result of the fourth case. Similarly, FIG. 21A shows the result of the third case, and FIG. 21B shows the result of the fourth case.

Referring to FIG. 20A and FIG. 21A, according to the third case of crystallizing the amorphous silicon by the conventional excimer laser annealing method, it may be confirmed that the characteristic of the transistor is changed for the case of repeating the folding operation along the first direction D1 parallel to the channel length direction of the transistor and the second direction D2 parallel to the channel width direction of the transistor. It may be seen that this characteristic change increases as the number of folding operations increases.

Particularly Referring to FIG. 20A, it may be confirmed that the change in the threshold voltage ($V_{th}$) value was more than 1 V, and referring to FIG. 21A, it may be seen that the change in the threshold voltage ($V_{th}$) value becomes large at more than 2 V in the case where the folding operation is repeated along the second direction D2.

In contrast, referring to FIG. 20B and FIG. 21B, according to the fourth case of crystallizing the amorphous silicon by the blue laser annealing method like the manufacturing method of the thin film transistor according to an exemplary embodiment, even if the folding operation was repeated along the first direction D1 parallel to the channel length direction of the transistor and the second direction D2 parallel to the channel width direction of the transistor, it may be confirmed that there was little change in the characteristic of the transistor. It was found that the change in the threshold voltage ($V_{th}$) was only within about 0.1 V.

Through the result of this experiment, according to the thin film transistor and the manufacturing method thereof according to the exemplary embodiment, even if the folding operation is repeated, it may be confirmed that the characteristic of the transistor does not change, and the display device including the transistor having stable performance may be implemented.

While this disclosure has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS 10, 20: display device 110: substrate
110a: supporting substrate 120: buffer layer
130: semiconductor layer 1301: channel region
1302: input region 1303: output region
140: gate insulation layer 150: control electrode
160: interlayer insulation layer 171: input electrode
172: output electrode 180: planarization layer
191: pixel electrode 270: common electrode
3: liquid crystal layer 31: liquid crystal molecules
410: organic light emission layer 70: organic light-emitting device
80: blue laser annealing apparatus 80a: excimer laser annealing apparatus

What is claimed is:

1. A manufacturing method of a thin film transistor, comprising:
    stacking a buffer layer on a substrate;
    forming a semiconductor layer including a channel region, an input region, and an output region on the buffer layer;
    forming a control electrode overlapping the channel region of the semiconductor layer; and
    forming an input electrode connected to the input region and an output electrode connected to the output region,
    wherein the forming of the semiconductor layer includes
    stacking an amorphous silicon layer on the buffer layer, and
    applying the blue laser on the amorphous silicon layer to form a polysilicon layer, and
    wherein an angle between grain boundaries of the polysilicon layer and a longitudinal direction of the channel region is within 30 degrees.

2. The manufacturing method of the thin film transistor of claim 1, wherein the blue laser beam having a wavelength of about 360 nm to 480 nm is applied during applying the blue laser on the amorphous silicon layer.

3. The manufacturing method of the thin film transistor of claim 1, wherein
    the semiconductor layer is formed to have the thickness of about 50 nm to about 300 nm, and
    the forming of the semiconductor layer includes
    crystallization by a blue laser line beam scan or crystallization by a blue laser beam scan having a point, a circle, or a polygon shape.

4. The manufacturing method of the thin film transistor of claim 1, wherein
    the substrate includes a plastic, and
    the buffer layer is formed to have the thickness of about 0.3 µm or more.

5. The manufacturing method of the thin film transistor of claim 1, wherein the amorphous silicon layer is fully melted by the applying the blue laser on the amorphous silicon layer to form a polysilicon layer.

6. The manufacturing method of the thin film transistor of claim 1, wherein the amorphous silicon layer is partially melted by the applying the blue laser on the amorphous silicon layer to form a polysilicon layer.

7. The manufacturing method of the thin film transistor of claim 1, wherein the amorphous silicon layer is solid-crystalized by the applying the blue laser on the amorphous silicon layer to form a polysilicon layer.

* * * * *